United States Patent
Ricchetti et al.

(10) Patent No.: US 6,594,802 B1
(45) Date of Patent: Jul. 15, 2003

(54) METHOD AND APPARATUS FOR PROVIDING OPTIMIZED ACCESS TO CIRCUITS FOR DEBUG, PROGRAMMING, AND TEST

(75) Inventors: Michael Ricchetti, Nashua, NH (US); Christopher J. Clark, Durham, NH (US); Bulent I. Dervisoglu, Mountain View, CA (US)

(73) Assignee: Intellitech Corporation, Durham, NC (US)

( * ) Notice: Subject to any disclaimer, the term of this patent is extended or adjusted under 35 U.S.C. 154(b) by 87 days.

(21) Appl. No.: 09/716,583

(22) Filed: Nov. 20, 2000

Related U.S. Application Data
(60) Provisional application No. 60/191,602, filed on Mar. 23, 2000.

(51) Int. Cl.⁷ .............................................. G06F 17/50
(52) U.S. Cl. ............................. 716/4; 716/16; 714/727
(58) Field of Search .................... 716/1–6, 16–18; 714/726, 727

(56) References Cited

U.S. PATENT DOCUMENTS

| | | | | |
|---|---|---|---|---|
| 5,048,021 A | * | 9/1991 | Jarwala et al. .............. 714/727 |
| 5,231,314 A | | 7/1993 | Andrews ...................... 307/480 |
| 5,329,471 A | * | 7/1994 | Swoboda et al. ............. 703/23 |
| 5,333,139 A | * | 7/1994 | Sturges ......................... 714/727 |
| 5,357,572 A | | 10/1994 | Bianco et al. ................. 380/23 |
| 5,495,486 A | | 2/1996 | Gheewala .................... 371/21.1 |
| 5,526,365 A | * | 6/1996 | Whetsel ....................... 714/726 |
| 5,596,734 A | | 1/1997 | Ferra ............................ 395/825 |
| 5,627,840 A | | 5/1997 | Hundetmark et al. ....... 371/22.3 |
| 5,648,973 A | * | 7/1997 | Mote, Jr. ...................... 714/727 |
| 5,682,392 A | | 10/1997 | Raymond et al. ........... 371/22.3 |
| 5,684,721 A | | 11/1997 | Swoboda et al. ........... 364/578 |
| 5,694,399 A | * | 12/1997 | Jacobson et al. ............ 709/246 |
| 5,708,773 A | * | 1/1998 | Jeppesen et al. ............... 714/30 |
| 5,752,006 A | * | 5/1998 | Baxter ............................ 703/14 |
| 5,869,980 A | | 2/1999 | Chu et al. ...................... 326/38 |
| 5,914,902 A | * | 6/1999 | Lawrence et al. ........... 365/201 |
| 6,006,343 A | | 12/1999 | Whetsel ......................... 714/28 |
| 6,016,555 A | | 1/2000 | Deao et al. .................... 714/35 |
| 6,026,230 A | * | 2/2000 | Lin et al. ....................... 703/13 |
| 6,026,461 A | * | 2/2000 | Baxter et al. ................ 710/120 |
| 6,032,279 A | * | 2/2000 | Ramamurthy et al. ...... 714/727 |
| 6,158,034 A | * | 12/2000 | Ramamurthy et al. ...... 714/727 |

OTHER PUBLICATIONS

*IEEE P1149.1/D2001.8 Draft Standard Test Access Port and Boundary–Scan Architecture*; ppl, 30–47; Jan. 9, 2001.

* cited by examiner

*Primary Examiner*—Matthew Smith
*Assistant Examiner*—Paul Dinh
(74) *Attorney, Agent, or Firm*—Weingarten, Schurgin, Gagnebin & Lebovici LLP

(57) ABSTRACT

An access interface for accessing electrical nodes of an electronic circuit for programming, testing, and debugging the electronic circuit. The access interface includes a protocol generator and a data generator that may be programmed to apply control and/or data sequences directly to the electronic circuit. The access interface performs operational commands based upon a plurality of states included in a programmable state machine. By suitably programming the protocol generator, the data generator, and the state machine, electrical nodes of the electronic circuit can be accessed in reduced time using a reduced number of operations. The access interface is controlled by a test resource apparatus, which communicates with the electronic circuit connected to the access interface. The access interface may be implemented as a downloadable circuit, e.g., it may be programmed into a programmable logic device by the test resource apparatus. Alternatively, the access interface may be implemented as a fixed/permanent circuit in an ASIC.

40 Claims, 15 Drawing Sheets

METHOD AND APPARATUS FOR PROVIDING OPTIMIZED ACCESS TO CIRCUITS FOR DEBUG, PROGRAMMING, AND TEST

CROSS REFERENCE TO RELATED APPLICATIONS

This application claims the priority of U.S. Provisional Patent Application No. 60/191,602 filed Mar. 23, 2000, entitled METHOD AND APPARATUS FOR PROVIDING OPTIMIZED ACCESS TO CIRCUITS FOR DEBUG, PROGRAMMING AND TEST.

STATEMENT REGARDING FEDERALLY SPONSORED RESEARCH OR DEVELOPMENT

N/A

BACKGROUND OF THE INVENTION

The present invention relates to apparatus and methods for accessing electrical nodes of electronic circuits for programming, testing, or debugging purposes.

One way of providing access to electrical nodes of Integrated Circuits (ICs) is commonly referred to as "scan testing," which typically involves serially shifting digital data into state elements included in an IC to apply logic levels to selected nodes as test stimuli, and serially shifting digital date out of the state elements to capture logic levels generated at other nodes in response to the test stimuli. Such control and observation of an IC's electrical nodes via state elements is also used to provide "visibility" into an IC for debugging purposes. Further, an IC that supports scan testing is frequently used to access electrical nodes of other electronic circuits connected thereto. For example, these other electronic circuits may be embedded within the IC, i.e., embedded memories or cores, or externally connected to the IC.

Scan testing is typically performed in accordance with the IEEE 1149.1 Standard described in the IEEE 149.1-1990 Standard Test Access Port and Boundary Scan Architecture specification, the entire disclosure of which is incorporated herein by reference. The IEEE 1149.1 Standard was primarily developed to solve problems related to Printed Circuit Board (PCB) testing. The IEEE 1149.1 Standard is also typically used to access "scan chains" within ICs to facilitate testing and debugging of ICs, PCBs, and systems.

"Boundary scan" is an application of scan testing at input and output (I/O) pins of an IC to provide direct control and observation of electrical nodes using boundary scan operations. Boundary scan involves a specific type of scan path having a boundary scan register cell at each I/O pin of an IC. For example, by performing boundary scan operations, known logic levels may be placed directly on outputs of one circuit and observed at inputs of another circuit connected thereto. Boundary scan therefore provides a way of determining whether circuits are properly connected to each other on, e. g., a PCB, and/or whether there are manufacturing defects on the PCB that may prevent the circuits from carrying out their intended mission. Boundary scan tests can detect different types of defects on a PCB, e.g., broken circuit traces, cold solder joints, solder bridges, and electrostatic-discharge (ESD) induced failures in IC buffers.

FIG. 1 depicts boundary scan architecture 100, which is compliant with the IEEE 1149.1 Standard and may be embedded in an IC to provide direct control and observation of electrical nodes via the IC's I/O pins. As depicted in FIG. 1, an IC compliant with the IEEE 1149.1 Standard includes the following four (4) mandatory pins: TDI, TDO, TCK, and TMS. Further, the IC optionally includes the pin, TRSTN. These pins, TDI, TDO, TCK, TMS, and optionally TRSTN, are commonly known as the Test Access Port (TAP).

In addition, the IC includes three (3) mandatory scan registers, i.e., an Instruction Register (IR) 104; and, two (2) Data Registers (DRs), i.e., a Boundary Scan Register (BSR) 106 and a Bypass Register (BYPASS) 108. Further, the IC optionally includes at least one User DR, i.e., a User DR 110, which may be used to implement tests such as internal scan path testing and Built-In Self-Test. (BIST). Moreover, the IC includes a protocol interface 102 known as a TAP Controller, which includes a 16-state Finite State Machine (FSM) operated by the mandatory TMS and TCK input pins and other logic.

FIG. 3 depicts a state diagram 300 for the standard FSM of the Tap Controller 102. A logic level on the TMS pins determines a next state of the FSM, and a clock signal on the TCK pin causes state transitions to occur. Further, an updated IR instruction selects the IR 104, the BSR 106, the BYPASS DR 108, or the USER DR 110 for scan operations. Moreover, the FSM includes a Select-DR branch 301 that defines states for performing a "DR-scan" operation and a Select-IR branch 303 that defines states for performing an "IR-scan" operation.

The IR 104, the BSR DR 106, the BYPASS DR 108, and the USER DR 110 each comprise a separate scan path; and, the TAP Controller 102 enables operation of only one of these scan registers at a time. The selected scan register shifts its scan data between the TDI pin and the TDO pin during a Shift-IR 324 state or a Shift-DR 310 state. Further, the selected scan register for the next set of scan operations is determined by the IR instruction that was previously updated in the IR 104 during an Update-IR 332 state. Moreover, the IEEE 1149.1 Standard uses both edges of the clock signal on the TCK pin. Specifically, a logic level on the TMS pin and scan data on the TDI pin are sampled on the rising edge of the clock signal, and scan data on the TDO pin changes on the falling edge of the clock signal.

The state diagram 300 of FIG. 3 includes six (6) "steady-states," i.e., a Test-Logic-Reset 302 state, a Run-Test/Idle 304 state, a Shift-DR 310 state, a Pause-DR 314 state, a Shift-IR 324 state, and a Pause-IR 328 state. According to the IEEE 1149.1 Standard, there is only one (1) steady-state when the TMS pin is set to logical 1, i.e., the Test-Logic-Reset 302 state; and, the FSM of the TAP Controller 102 can be reset (i.e., transition to the Test-Logic-Reset 302 state) within five (5) TCK clock signal transitions while the TMS pin is set to logical 1. The optional TRSTN pin provides another way to reset the FSM of the TAP Controller 102. For example, setting the TRSTN pin to logical 0 causes an asynchronous reset of the TAP Controller 102 FSM.

The DR branch 301 and the IR branch 303 of the TAP Controller 102 FSM each includes six (6) states. Specifically, a Capture state, e.g., a Capture-DR 308 state and a Capture-IR 322 state, causes a selected scan register to capture data via parallel inputs of the scan register. This captured data is shifted out of the selected register on the TDO pin during the Shift-DR 310 state or the Shift-IR 324 state, while new scan data is simultaneously shifted into the register via the TDI pin.

After the scan shift operation is completed, new scan data is updated into a parallel update stage of the scan register. An IR or DR update operation is enabled upon entering either the Update-IR 332 state or the Update-DR state 318, respectively.

A state sequence including an Exit1-DR 312 state, immediately followed by a Pause-DR 314 state, and immediately followed by an Exit2-DR 316 state is used to terminate or suspend the Shift-DR 310 state operation. Similarly, a state sequence including an Exit1-IR 326 state, immediately followed by a Pause-IR 328 state, and immediately followed by an Exit2-IR 330 state is used to terminate or suspend the Shift-IR 324 state operation. The Pause-DR 314 state and the Pause-IR 328 state are included in the TAP Controller 102 FSM primarily to account for potentially slow tester hardware and/or software performance.

The instructions updated in the IR 104 not only select scan registers for shifting scan data, but also determine test behavior, e.g., for boundary scan testing of PCB interconnects. The IEEE 1149.1 Standard specifies three (3) mandatory instructions and their corresponding test behavior. One such instruction is the BYPASS instruction, which selects the BYPASS DR 108 to provide a 1-bit scan path between TDI and TDO. For example, scan paths of multiple circuits compliant with the IEEE 1149.1 Standard may be chained together by serially connecting their respective TDI and TDO pins. The BYPASS instruction may then be used to "bypass" these potentially long scan paths when DRs corresponding thereto do not have to be accessed for particular test or debug operations. In this way, the BYPASS instruction(s) may be used to reduce the number of scan bits that are shifted.

Other mandatory instructions are the SAMPLE/PRELOAD and EXTEST instructions, both of which select the BSR 106. Specifically, the SAMPLE/PRELOAD instruction is used to sample logic levels on an IC's I/O pins during normal operation and pre-load data into the BSR 106 before testing. The IC's I/O pins are controlled by normal system logic during the SAMPLE/PRELOAD instruction. The EXTEST instruction controls the IC's I/O pins from the BSR 106 and may be used to perform PCB interconnect testing.

Although the boundary scan architecture 100 can be used to program, test, and debug electronic circuits, the boundary scan architecture 100 has several drawbacks. For example, in accordance with the IEEE 1149.1 Standard, the Pause-IR 328 state and the Pause-DR 314 state are included in the Select-IR branch 303 and the Select-DR branch 301, respectively, of the TAP Controller 102 FSM primarily to account for less than optimal tester hardware and/or software performance. However, the hardware and software of today's test resources are normally fast enough to shift scan data continuously without requiring the Pause-IR 328 and Pause-DR 314 states. Accordingly, these states merely increase the time required to perform such shift operations.

In addition, in ICs compliant with the IEEE 1149.1 Standard and PCBs including such components, it is frequently difficult to access electrical nodes of non-scan sequential circuits from scan paths surrounding these circuits. Such non-scan sequential circuits may include non-scan embedded cores and component clusters on PCBs. The IEEE 1149.1 Standard is particularly inefficient when used to access memories, whether the memories are embedded within an IC or externally connected to an IC. This is because memories typically require long and/or complex control and address sequences to fully access their contents and provide comprehensive testing thereof, and ICs compliant with the IEEE 1149.1 Standard often cannot efficiently handle such long and complex sequences.

Specifically, if the BSR 106 of an IC were used to move data to a memory externally connected to the IC, then read/write cycles of the memory would typically be emulated using the Select-DR branch 301 of the TAP Controller 102 FSM, and data would typically be shifted into the BSR 106 to sequence the data, address, and control signals of the memory. This is conventionally done by putting the IC into the EXTEST mode, shifting a pattern of address, data, and control values into corresponding bit positions of the BSR 106, and updating the BSR 106 to apply the bit pattern to the memory in parallel.

However, any change in a control value, e.g., to place a logical 0 on a write enable (WEN) pin, therefore requires multiple BSR shift operations. This can be very inefficient for complex access sequences, wherein several BSR scan operations may be required to read from or write to a single address location of the memory. Further, read/write control sequences must be serialized to apply these same sequences through the BSR 106.

Still further, each BSR scan operation scans all of the bits in the BSR 106, not just those bits needed to access the memory data, address, and control signals. This also decreases efficiency because in a typical IC with high-density I/O packaging, e.g., a Ball Grid Array (BGA), the BSR 106 can be several hundred bits in length yet only a fraction of these bits typically needs to be accessed to control the memory signals.

In addition, the protocol of the TAP Controller 102 FSM prohibits certain types of testing. Specifically, the TAP Controller 102 FSM does not provide for a state sequence including the Shift-DR state, immediately followed by the Capture-DR state, and immediately followed by the Shift-DR state, which is normally required for controlling internal scan registers; or, a state sequence including the Update-DR state immediately followed by the Capture-DR state, which is normally required for performing path delay testing of interconnects.

It would therefore be desirable to have improved apparatus and methods that provide for the access of electrical nodes of electronic circuits including scan and non-scan sequential circuits and combinatorial circuits. It would also be desirable to have improved apparatus and methods that efficiently access electrical nodes of electronic circuits that require long and/or complex control and address sequences.

BRIEF SUMMARY OF THE INVENTION

In accordance with the present invention, apparatus and methods are disclosed for providing optimized access to electrical nodes of electronic circuits for programming, testing, and debugging. The presently disclosed apparatus includes an access interface circuit that can be connected between a test resource and an electronic circuit such as a circuit adapted for scan testing, a non-scan sequential circuit, a component cluster, or a memory circuit. The access interface circuit includes a protocol generator, which has a control register queue and an address register; and, a data generator, which has a plurality of registers adapted for capturing, shifting, and/or updating data samples. Address and control sequences for programming/testing/debugging the electronic circuit can be serially loaded into the control register queue and the address register using the test resource. Data sequences for programming/testing/debugging the electronic circuit can also be serially loaded into the data registers using the test resource. The access interface circuit also includes circuitry for switchably and directly applying either the serially loaded address and control sequences or the normal system address and control signals to the electronic circuit; and, for switchably and directly applying either the serially loaded data sequences or the normal system data signals to the electronic circuit. The access interface circuit further includes circuitry for directly capturing data values from the electronic circuit in the data registers. The access interface circuit therefore allows complex access sequences to be efficiently applied to the electronic circuit, and data sequences to be efficiently written to and read from the electronic circuit under control of the test resource. Such capability is particularly useful in programming/testing/debugging memory and non-scan circuits.

The presently disclosed apparatus further includes a programmable controller connected to the access interface circuit and connectable to the test resource. The programmable controller includes a state machine having a plurality of states at least one of which is programmable. The access interface circuit performs operational commands based on at least a portion of the plurality of states. Because the state machine is programmable, the programmable controller enhances the flexibility of the access interface circuit for programming/testing/debugging electronic circuits. The access interface circuit also includes at least one scan path connectable to the electronic circuit; and, circuitry for switchably applying, under control of the programmable controller, address/control sequences from the protocol generator, data sequences from the data generator, and/or data sequences from the test resource to the scan path. The control register queue and address register of the protocol generator and the data registers of the data generator comprise minimal length scan paths that can be used for efficiently programming/testing/debugging the circuits adapted for scan testing.

The access interface circuit and/or the programmable controller may be controlled by way of the test resource to enable communication between the test resource and the electronic circuit connected to the access interface circuit. The test resource can be any type of apparatus customarily used to program/test/debug electronic circuits, such as Automatic Test Equipment (ATE) or a general-purpose computer, e.g., a Personal Computer (PC), connected to the access interface circuit. Alternatively, the test resource may be embedded with the access interface circuit and the programmable controller in a device such as an IC.

The access interface circuit and/or the programmable controller may be designed into a device as a permanent/fixed interface; or, in the case of a programmable logic device such as a Field Programmable Gate Array (FPGA), the access interface/programmable controller may be temporarily programmed into the device. By utilizing the latter method, electronic circuits coupled to the access interface may be temporarily accessed for programming/testing/debugging purposes via the FPGA, and the FPGA can be subsequently re-programmed with its normal mission mode logic.

Other features, functions, and aspects of the access interface will be evident from the Detailed Description of the Invention that follows.

BRIEF DESCRIPTION OF THE SEVERAL VIEWS OF THE DRAWING

The invention will be more fully understood by reference to the following Detailed Description of the Invention in conjunction with the Drawing of which.

DETAILED DESCRIPTION OF THE INVENTION

This application claims the priority of U.S. Provisional Patent Application No. 60/191,602 filed Mar. 23, 2000, the entire disclosure of which is incorporated herein by reference.

Figure 2:
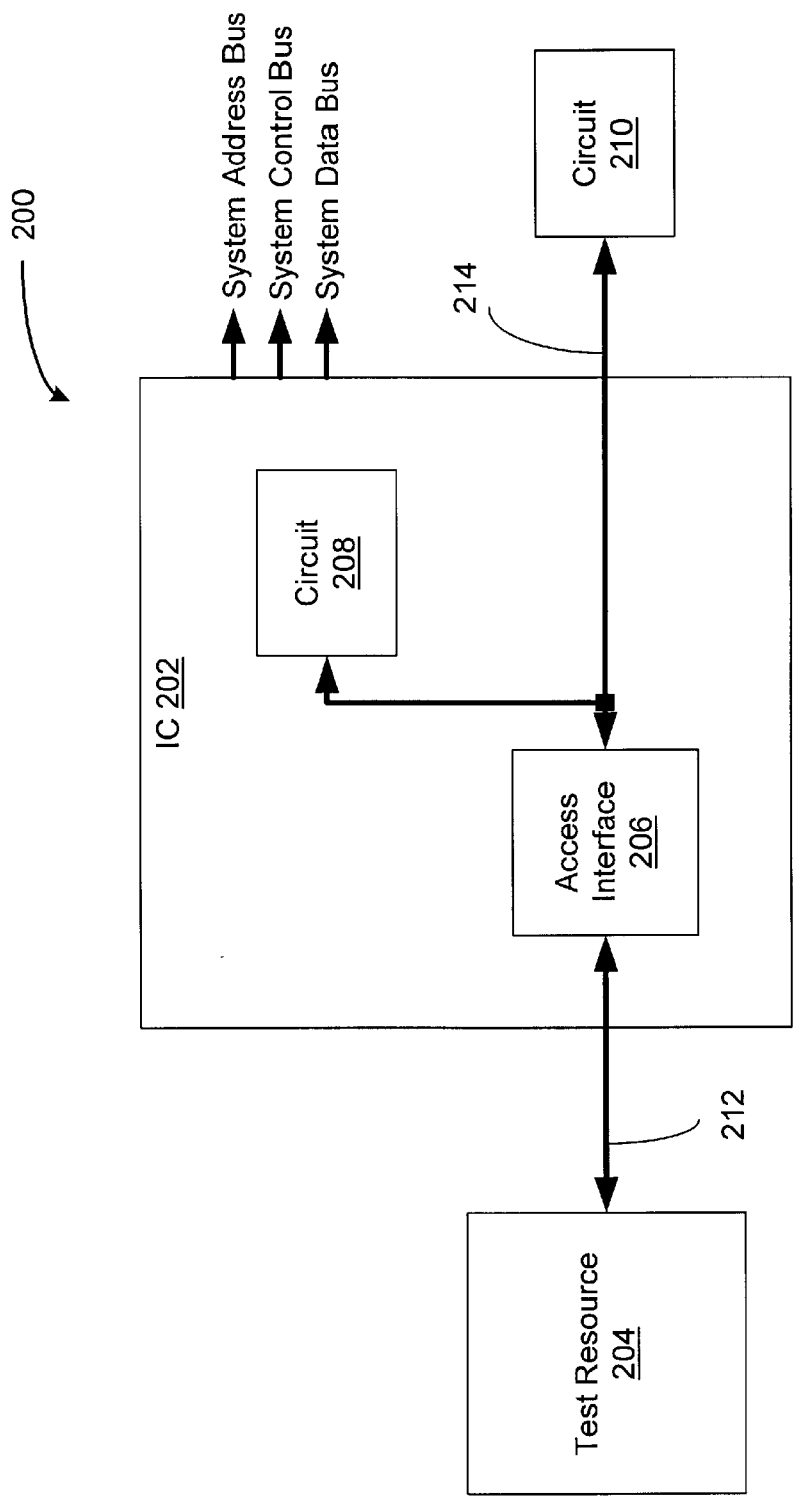
FIG. 2 is a block diagram depicting a test configuration operative in a manner according to the present invention.

FIG. 2 depicts an illustrative embodiment of a test configuration 200 operative in a manner according to the present invention. Specifically, the test configuration 200 includes an access interface 206 that allows communications between a test resource 204 and electronic circuits 208 and 210 under test. In this illustrative embodiment, both the access interface 206 and the electronic circuit 208 are embedded in an IC 202; and, the electronic circuit 210 external to the IC 202 is connected to the access interface 206 and the circuit 208 by way of a bus 214 coupled to at least one I/O pin of the IC 202. Similarly, the test resource 204 is connected to the access interface 206 by way of a bus 212 coupled to at least one I/O pin of the IC 202.

In one embodiment, the IC 202 used to implement the access interface 206 may be an Application Specific Integrated Circuit (ASIC). In this case, the access interface 206 has a fixed configuration, although it may be configured to access any number or types of circuits such as electronic circuits 208 or 210. In another embodiment, the IC 202 used to implement the access interface 206 may be a programmable device such as an FPGA. In this case, the FPGA may be programmed to implement the access interface 206 via the test resource 204, and different configurations of the access interface 206 may be re-programmed into in the FPGA to access any number or types of circuits. After testing, debugging, or programming devices coupled to the access interface 206, the FPGA may be re-programmed to perform its intended system function.

Those of ordinary skill in this art will appreciate that other test configurations are possible. For example, the access interface 206 may be implemented on an IC that is separate from any IC including circuits under test. Further, the test resource 204 may alternatively comprise a programming or debugging resource, and the combination of the test resource 204 and the access interface 206 may be used to program or debug the circuits 208 and 210.

The test resource 204 may comprise at least one memory such as a ROM or RAM, and at least one processor operative for executing programs stored in the memory, including applications for communicating with the access interface 206 to program, test, or debug the circuits 208 and 210. Further, as depicted in FIG. 2, the test resource 204 may be externally connected to the IC 202 incorporating the access interface 206. Alternatively, the test resource 204 may be embedded in the IC 202.

It should be understood that the test configuration 200 may include more than one access interface; and, each access interface may be connected to one or more electronic circuits such as the embedded circuit 208 and the external circuit 210.

Figure 1:
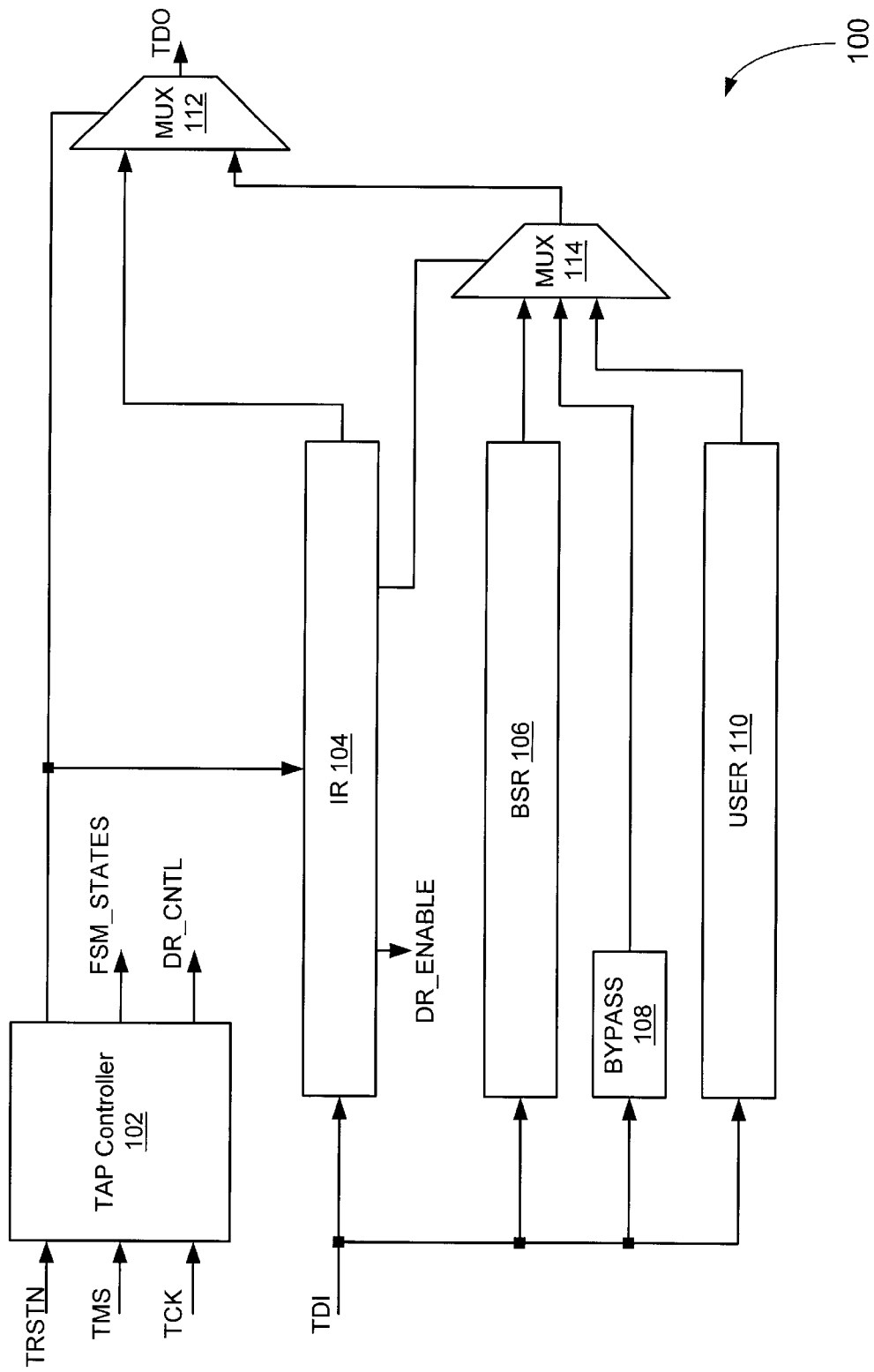
FIG. 1 is a block diagram depicting the Standard IEEE 1149.1 Test Access Port and Boundary Scan Architecture.
Figure 3:
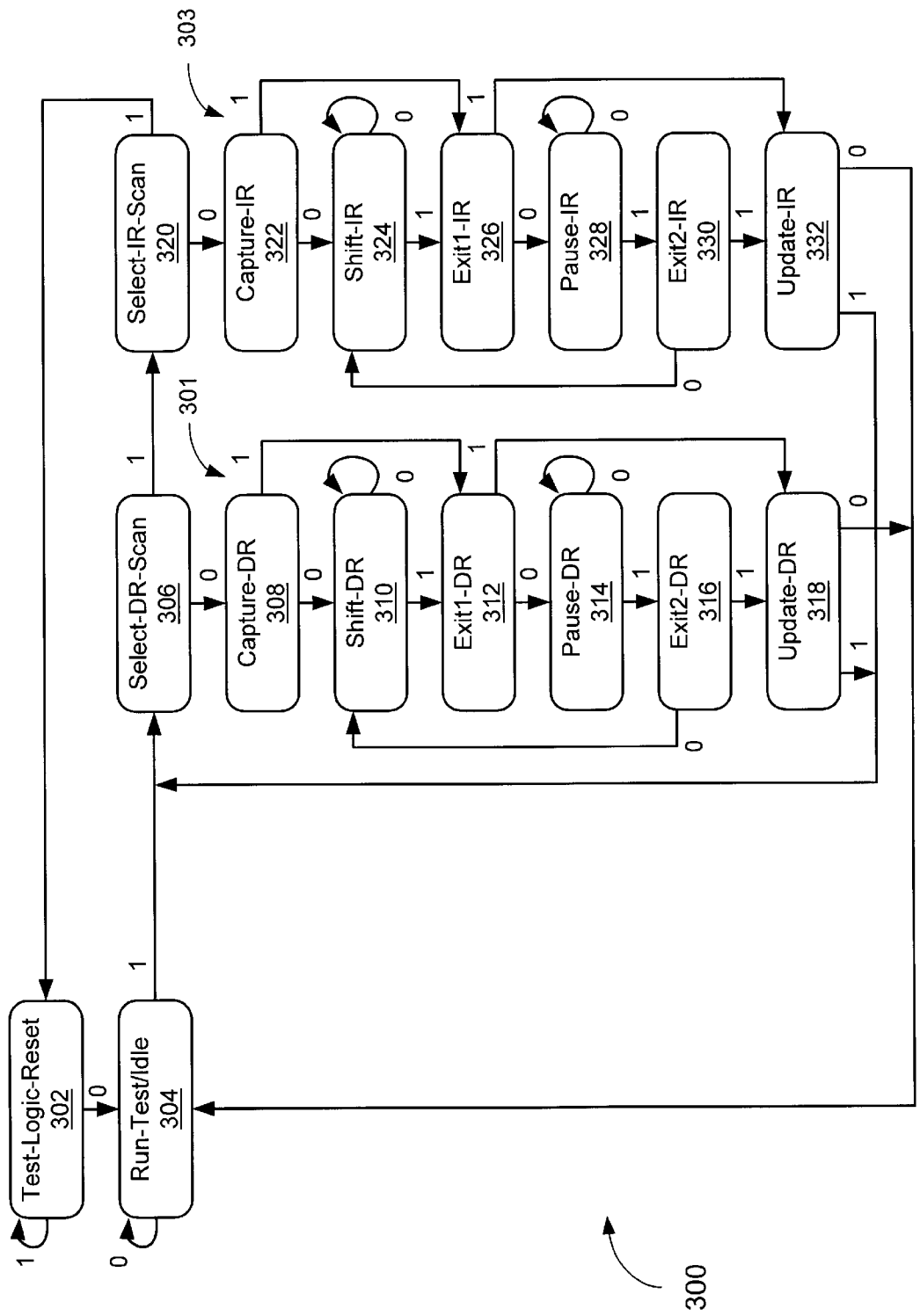
FIG. 3 is a flow diagram depicting the operation of the finite state machine for the Standard IEEE 1149.1 Test Access Port Controller.
Figure 4:
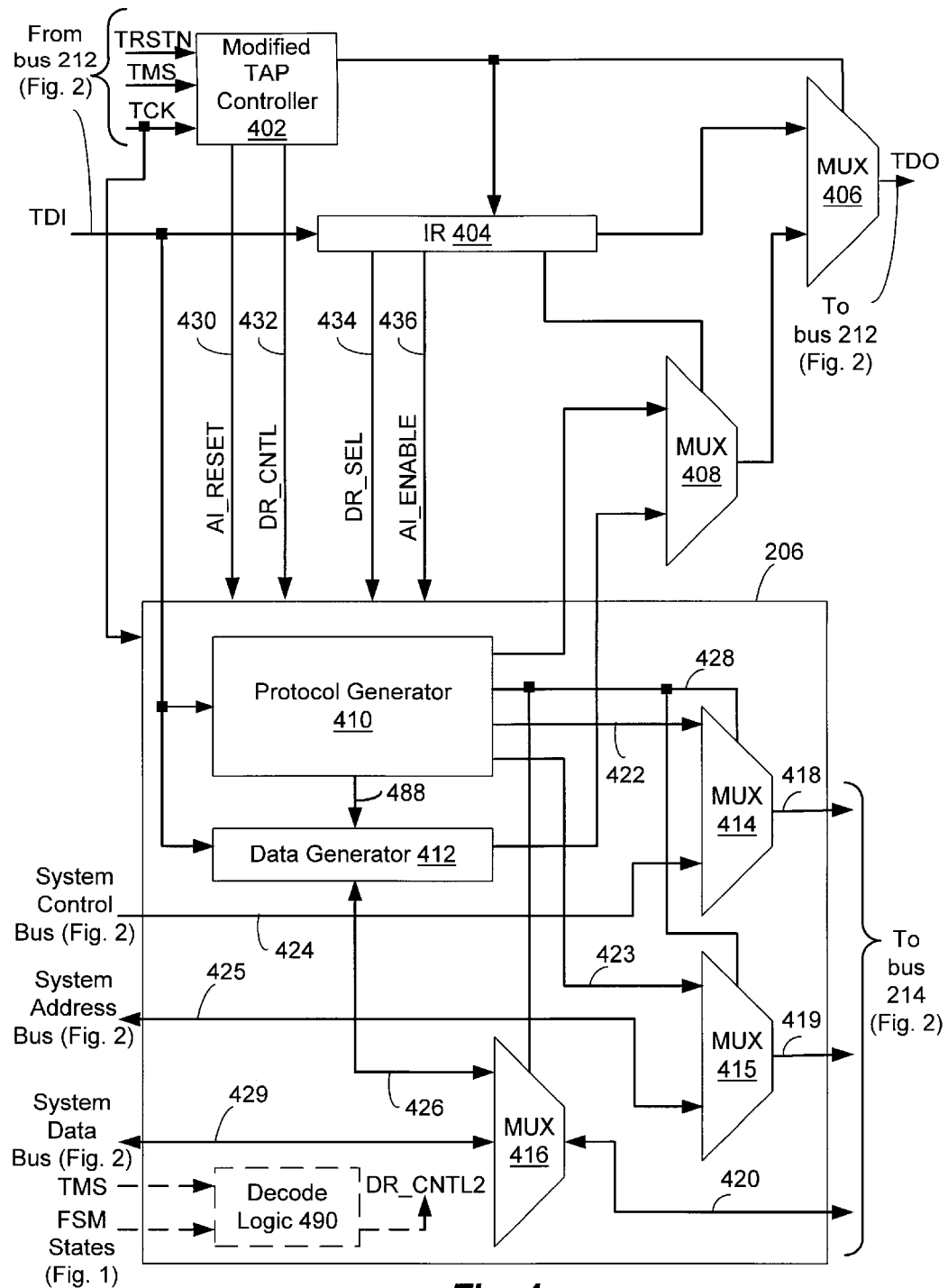
FIG. 4 is a block diagram depicting an access interface and a controller used in the test configuration of FIG. 2.

FIG. 4 depicts an illustrative embodiment of the access interface 206 that can be used to program, test, or debug the circuits 208 and 210. Specifically, the access interface 206 is connected to a protocol interface 402 and an Instruction Register (IR) 404. In one embodiment, the protocol interface 402 comprises the standard TAP Controller 102 (see FIGS. 1 and 3). In a preferred embodiment, the protocol interface 402 is a modified TAP Controller, which will be described in detail below. In this illustrative embodiment, the access interface 206, the modified TAP Controller 402, the IR 404, and multiplexors 406 and 408 connected thereto, are embedded in the IC 202 (see FIG. 2) and operatively connected to the test resource 204 and the circuits 208 and 210.

More specifically, the modified TAP Controller 402 is connected to the test resource 204 by way of the bus 212, which is coupled to input pins TRSTN, TMS, and TCK of the IC 202. Similarly, the access interface 206, the IR 404, and the multiplexor 406 are connected to the test resource 204 by way of the bus 212, which is also coupled to an input pin TDI and an output pin TDO. Still further, the access interface 206 is connected to the circuits 208 and 210 by way of the bus 214, which is coupled to a CONTROL bus 418, an ADDRESS bus 419, and a bi-directional DATA bus 420.

In this illustrative embodiment, the TDI, TDO, TCK, and TMS pins correspond to the mandatory pins of the IEEE 1149.1 Standard; and, the TRSTN pin corresponds to the optional input pin of the IEEE 1149.1 Standard. Accordingly, registers included in the access interface 206 can serially receive data via the TDI pin, and serially transmit data on the TDO pin by way of the multiplexors 406 and 408.

In addition, the modified TAP Controller 402 includes conventional circuitry for providing an AI_RESET signal on a line 430 and DR_CNTL signals on a bus 432 to the access interface 206; and, the IR 404 includes conventional circuitry for providing DR_SEL signals on a bus 434 and a AI_ENABLE signal on a line 436 to the access interface 206. Specifically, the DR_SEL signals are used to select a register in the access interface 206; the DR_CNTL signals are used to control register operations (e.g., Capture, Shift, and Update operations) using the selected register; the AI_RESET signal is used to reset the access interface 206; and, the AI_ENABLE signal is used to enable the access interface 206. The operation of these signals will be described in detail below.

As depicted in FIG. 4, the access interface 206 includes a protocol generator 410, which is connected to a multiplexor 414 for providing control signals in programmed sequences to the circuits 208 and 210 on the bus 418. Specifically, the multiplexor 414 receives a signal from the protocol generator 410 on lines 428 to select between normal system control signals of the circuits 208 and 210 on a bus 424 and programmed protocol signals on a bus 422. In this illustrative embodiment, the normal system control signals are provided by the IC 202 (see FIG. 2).

Similarly, the protocol generator 410 is connected to a multiplexor 415 and can be used to provide address signals in programmed sequences to the circuits 208 and 210 on the bus 419. Specifically, the multiplexor 415 receives a signal from the protocol generator 410 on the lines 428 to select between normal system address signals of the circuits 208 and 210 on a bus 425 and programmed address signals on a bus 423. In this illustrative embodiment, the normal system address signals are provided by the IC 202 (see FIG. 2). The protocol generator 410 further includes a sequence generator 802 comprising a plurality of registers, e.g., registers SR1 through SRN, and an address register (AR) 804 (see FIG. 8), that are connected between the TDI and TDO pins.

The access interface 206 also includes a data generator 412, which includes another plurality of registers, e.g., a register 601 comprising registers 602 and 604 (see FIG. 6), and separate registers 702 and 704 (see FIG. 7), that are connected between the TDI and TDO pins. Specifically, the registers of the data generator 412 receive the DR_SEL signals from the IR 404 and the DR_CNTL signals from the modified TAP Controller 402 for use in performing, e.g., Capture, Shift, and Update operations.

The data generator 412 is connected to a multiplexor 416 for providing data signals to the circuits 208 and 210 on the bus 420. Specifically, the multiplexor 416 receives a signal from the protocol generator 410 on the lines 428 to select between the data signals generated by the data generator 412 on bus 426 and normal system data signals of the circuits 208 and 210 on bus 429. In this illustrative embodiment, the normal system data signals are provided by the IC 202 (see FIG. 2).

The registers of the data generator 412 vary in length depending upon specific applications and numbers of data inputs and outputs of the circuits 208 and 210. In a preferred embodiment, the registers of the data generator 412 include as many cells or bits as there are data inputs and outputs of the circuits 208 and 210.

The registers of the data generator 412 also provide specialized data access and/or test functions. For example, in BIST implementations, the data generator 412 may include a Linear Feedback Shift Register (LFSR) for providing test stimuli and a Multiple Input Signature Register (MISR) for capturing a circuit response.

Figure 5:
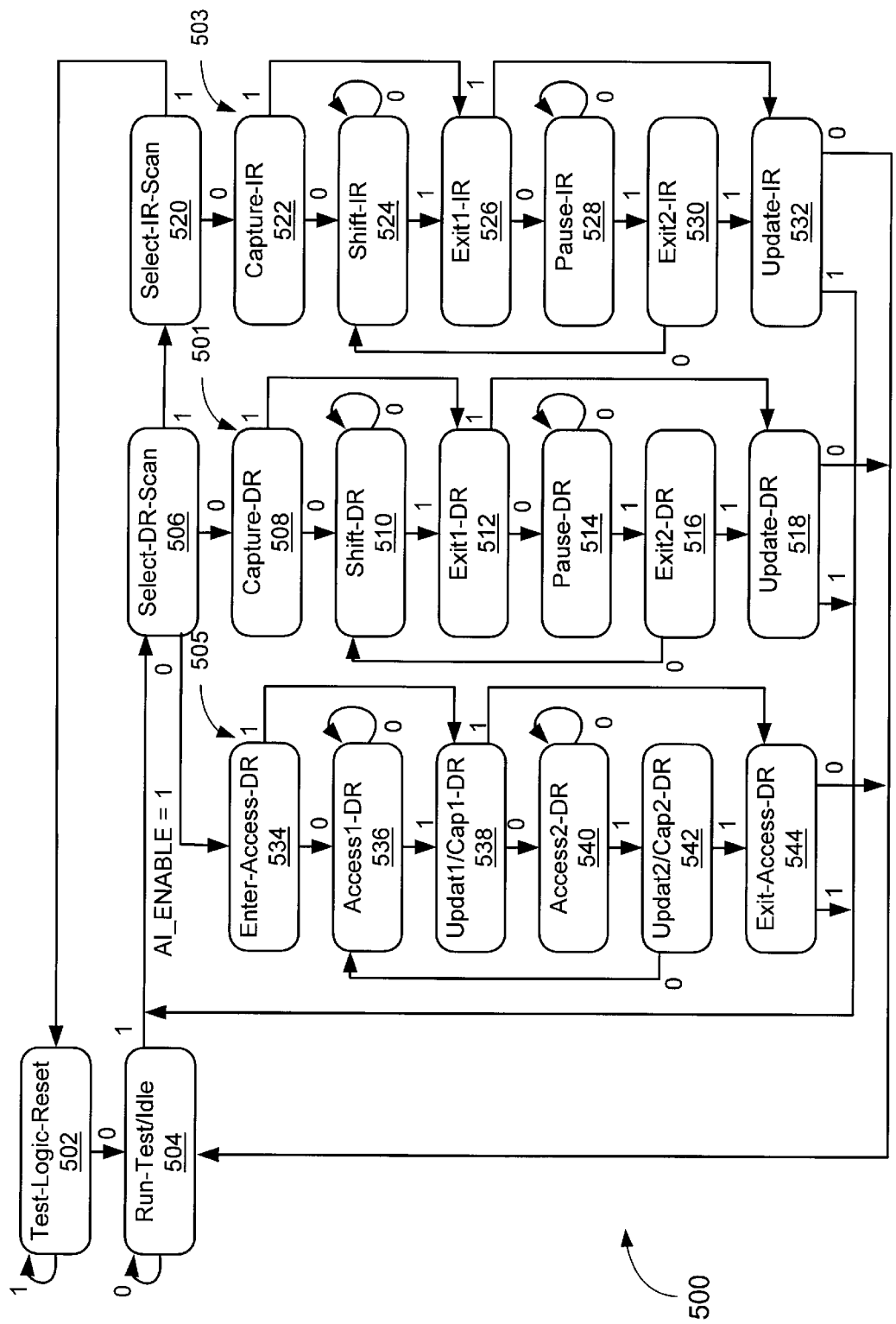
FIG. 5 is a flow diagram depicting the operation of the finite state machine for the controller of FIG. 4.

FIG. 5 depicts a state diagram 500 for the FSM of the modified TAP Controller 402. Specifically, the state diagram 500 includes eight (8) steady-states, i.e., a Test-Logic-Reset 502 state, a Run-Test/Idle 504 state, a Shift-DR 510 state, a Pause-DR 514 state, a Shift-IR 524 state, a Pause-IR 528 state, an Access1-DR 536 state, and an Access2-DR 540 state. Further, the state diagram 500 includes a Select-IR branch 503 that defines a sequence of states for performing an "IR-scan" operation, a Select-DR branch 501 that defines a sequence of states for performing "DR-scan" operations, and an access interface branch 505 that defines a sequence of states for performing programmable access operations using the access interface 206.

The logic level of the AI_ENABLE signal (initially logical 0; "AI_ENABLE is low") and the logic level at the TMS pin determine a next state of the modified TAP Controller 402 FSM, and the clock signal at the TCK pin ("the TCK clock") causes state transitions to occur. Specifically, the state diagram 500 shows that the Test-Logic-Reset 502 state is a steady-state when the level at the TMS pin is logical 1 ("TMS is high"). Next, if the level at the TMS pin changes from logical 1 to logical 0 ("TMS is low"), then there is a transition from the Test-Logic-Reset 502 state to the Run-Test/Idle 504 state at the next rising edge of the TCK clock. The Run-Test/Idle 504 state is a steady-state when TMS is low.

If the level at the TMS pin now changes from low to high, then there is a transition from the Run-Test/Idle 504 state to the Select-DR-Scan 506 state at the next rising edge of the TCK clock. As depicted in FIG. 5, either the Select-DR branch 501 or the access interface branch 505 can be selected as the next sequence of states from the Select-DR-Scan 506 state. Otherwise, at the next rising edge of the TCK clock, there is a transition from the Select-DR-Scan 506 state to the Select-IR-Scan 520 state. As depicted in FIG. 5, the Select-IR branch 503 can be selected as the next sequence of states from the Select-IR-Scan 520 state.

Specifically, if the level of the TMS pin changes from high to low when in the Select-DR-Scan 506 state, then at the next rising edge of the TCK clock there is a transition from the Select-DR-Scan 506 state to the Capture-DR 508 state, which is the first state in the Select-DR branch 501. Similarly, if the level of the TMS pin changes from high to low when in the Select-IR-Scan 520 state, then at the next rising edge of the TCK clock there is a transition from the Select-IR-Scan 520 state to the Capture-IR 522 state, which is the first state in the Select-IR branch 503. In this illustrative embodiment, the state sequences in the Select-DR branch 501 (i.e., states 508, 510, 512, 514, 516, and 518) and the Select-IR branch 503 (i.e., states 522, 524, 526, 528, 530, and 532) are the same as those in the corresponding Select-DR branch 301 and Select-IR branch 303, respectively, of the standard TAP Controller 102 FSM (see FIGS. 1 and 3).

Further, if the level of the TMS pin changes from high to low and the level of the AI_ENABLE signal changes from low to high ("AI_ENABLE is high") when in the Select-DR-Scan 506 state, then at the next rising edge of the TCK clock there is a transition from the Select-DR-Scan 506 state to an Enter-Access-DR 534 state, which is the first state in the access interface branch 505. As depicted in FIG. 5, each branch 501, 503, and 505 of the state diagram 500 is compliant with the IEEE 1149.1 Standard in that the modified TAP Controller 402 FSM can be reset to the Test-Logic-Reset 502 state within 5 cycles of the TCK clock when TMS is high.

As mentioned above, in this illustrative embodiment, the Select-DR branch 501 and the Select-IR branch 503 of the state diagram 500 correspond to the Select-DR branch 301 and the Select-IR branch 303, respectively, of the standard TAP Controller 102 FSM. Accordingly, the operations performed in the respective state sequences of the Select-DR branch 501 and the Select-IR branch 503 are fixed. In contrast, the operations performed in the state sequence of the access interface branch 505 (i.e., states 534, 536, 538, 540, 542, and 544) are programmable.

For example, the operations performed in the state sequence of the access interface branch 505 may be programmed in response to a predetermined event such as the provision of an electronic circuit with internal scan registers. Accordingly, the access interface branch 505 may be programmed to generate a repeatable Shift/Capture sequence, which may then be used to control operations using the internal scan registers.

Specifically, if the level of the TMS pin remains low when in the Enter-Access-DR 534 state, then at the next rising edge of the TCK clock there is a transition from the Enter-Access-DR 534 state to the Access1-DR 536 state. For example, the Access1-DR 536 state may be programmed to perform either a Shift operation on a selected register or a Pause operation. Further, the Access1-DR 536 state is a steady-state when TMS is low.

If the level of the TMS pin changes from low to high when in the Access1-DR 536 state, then at the next rising edge of the TCK clock there is a transition from the Access1-DR 536 state to an Update1/Capture1-DR 538 state. For example, the Update1/Capture1-DR 538 state may be programmed to perform an Update operation only, a Capture operation only, or both the Update and Capture operations. Specifically, when the Update1/Capture1-DR 538 state is programmed to perform both the Update and Capture operations, at the next falling edge of the TCK clock after transitioning to the Update1/Capture1-DR 538 state, the Update operation is performed; and, at the next rising edge of the TCK clock, the Capture operation is performed followed by a transition from the Update1/Capture1-DR 538 state to the next state.

If the level of the TMS pin now changes from high to low, then at the next rising edge of the TCK clock there is a transition from the Update1/Capture1-DR 538 state to the Access2-DR 540 state. Like the Access1-DR 536 state, the Access2-DR 540 state may be programmed to perform either a Shift operation on the selected register or a Pause operation. Further, the Access2-DR 540 state is a steady-state when TMS is low.

If the level of the TMS pin changes from low to high when in the Access2-DR 540 state, then at the next rising edge of the TCK clock there is a transition from the Access2-DR 540 state to an Update2/Capture2-DR 542 state. Like the Update1/Capture1-DR 538 state, the Update2/Capture2-DR 542 state may be programmed to perform an Update operation only, a Capture operation only, or both the Update and Capture operations.

Finally, if the level of the TMS pin remains high, then at the next rising edge of the TCK clock there is a transition from the Update2/Capture2-DR 542 state to an Exit-Access-DR 544 state, which is the last state in the access interface branch 505.

It should be noted that if the level of the TMS pin changes from low to high when in the Enter-Access-DR 534 state, then at the next rising edge of the TCK clock there is a transition from the Enter-Access-DR 534 state to the Update1/Capture1-DR 538 state. Further, if the level of the TMS pin remains high when in the Update1/Capture1-DR 538 state, then at the next rising edge of the TCK clock there is a transition from the Update1/Capture1-DR 538 state to the Exit-Access-DR 544 state. Still further, if the level of the TMS pin changes from high to low when in the Update2/Capture2-DR 542 state, then at the next rising edge of the TCK clock there is a transition from the Update2/Capture2-DR 542 state to the Access1-DR 536 state.

When AI_ENABLE is high, the access interface 206 is enabled. As a result, subsequent operations are performed on selected registers included in the access interface 206. It should be understood that instructions loaded into the IR 404 not only select the registers in the access interface 206, but also program the states 536, 538, 540, and 542 of the access interface branch 505. The operations are then sequenced as the modified TAP Controller 402 FSM follows the access interface branch 505. The access interface 206 may have any number of instructions corresponding thereto, depending upon the circuits to be accessed and the desired applications.

Specifically, if the instruction loaded into the IR 404 selects a register of the data generator 412 and programs the Access1-DR 536 state to perform a Shift operation, then upon entering the Access1-DR 536 state, data in the selected register may be shifted while the protocol generator 410 concurrently executes a sequence of access operations on the circuit 208 or 210. Further, the amount of data shifted and the access sequence length may be precisely controlled based upon the number of TCK clock cycles that occurs when in the Access1-DR 536 state. Alternatively, the instruction loaded into the IR 404 may program the Access1-DR 536 state to perform a Pause operation only to pause the data generator 412 for a predetermined number of TCK clock cycles while the protocol generator 410 concurrently executes. The Access2-DR 540 state may be programmed in a similar manner.

The Update1/Capture1-DR 538 and Update2/Capture2-DR 542 states also allow programmable Update and Capture operation sequences to occur based upon instructions loaded into the IR 404. For example, the instruction loaded into the IR 404 may select a register of the data generator 412, program the Update1/Capture1-DR 538 state to perform an Update operation, and program the Update2/Capture2-DR 542 state to perform a Capture operation using the selected register.

In addition, the Access1-DR 536 state, the Update1/Capture1-DR 538 state, and the Access2-DR 540 state may be similarly programmed to generate a Shift/Capture/Shift sequence, which may be used to control operations on internal scan registers. In this way, an Update operation, which is typically not required for controlling operations on internal scan registers, can be eliminated from this sequence.

In addition, both the Update1/Capture1-DR 538 and Update2/Capture2-DR 542 states may be programmed to generate an Update operation immediately followed by a Capture operation. This Update/Capture sequence makes it possible to perform path delay testing of interconnects using standard boundary scan cells.

In addition, the Update1/Capture1-DR 538 and Access2-DR 540 states may be programmed to generate a Capture/Shift sequence, which may be used to capture read data from a memory circuit into a register of the data generator 412 and then immediately start shifting the read data out.

In addition, either the Update1/Capture1-DR 538 state or the Update2/Capture2-DR 542 state may be programmed to inhibit both the Update and the Capture operations. As a result, these states may be used for merely starting, stopping or continuing execution of the protocol generator 410.

Upon entering the Exit-Access-DR 544 state, the access interface 206 is disabled. Further, depending upon whether TMS is high or low, at the next rising edge of the TCK clock there may be a transition from the Exit-Access-DR 544 state to either the Run-Test/Idle 504 state to "park" the modified TAP Controller 402 or to the Select-DR-Scan 506 state to start a new operation.

Figure 6:
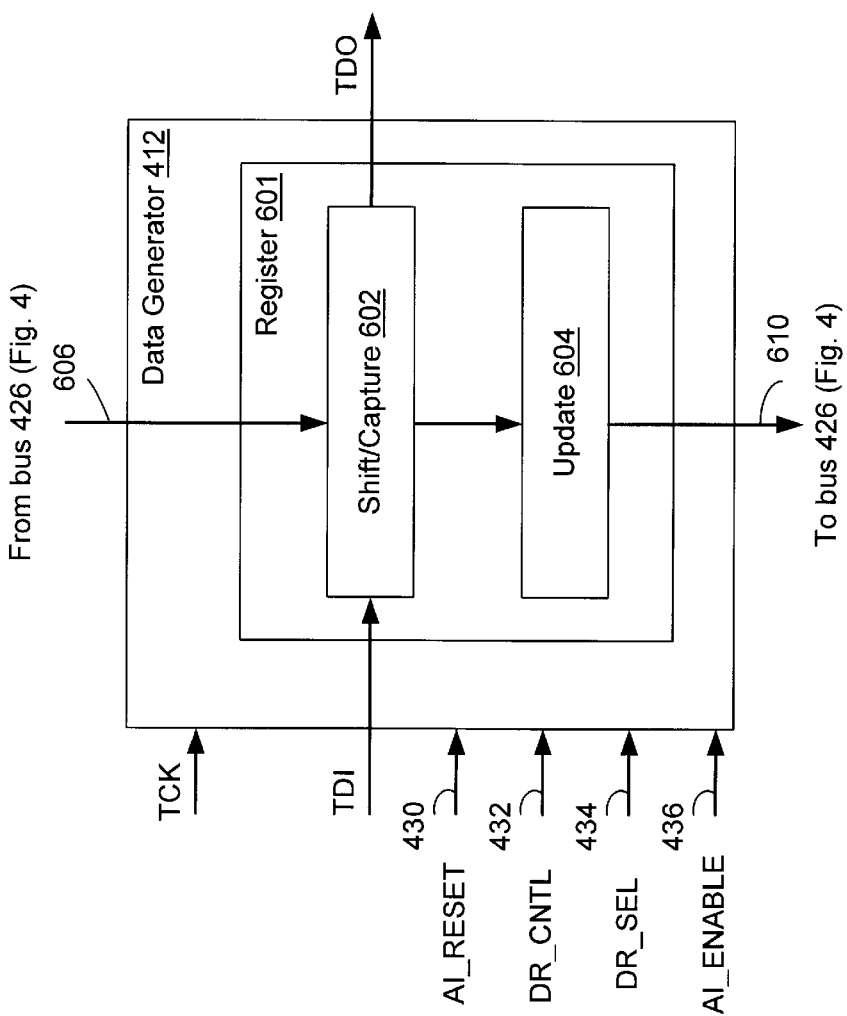
FIG. 6 is a block diagram depicting a data generator included in the access interface of FIG. 4.
Figure 7:
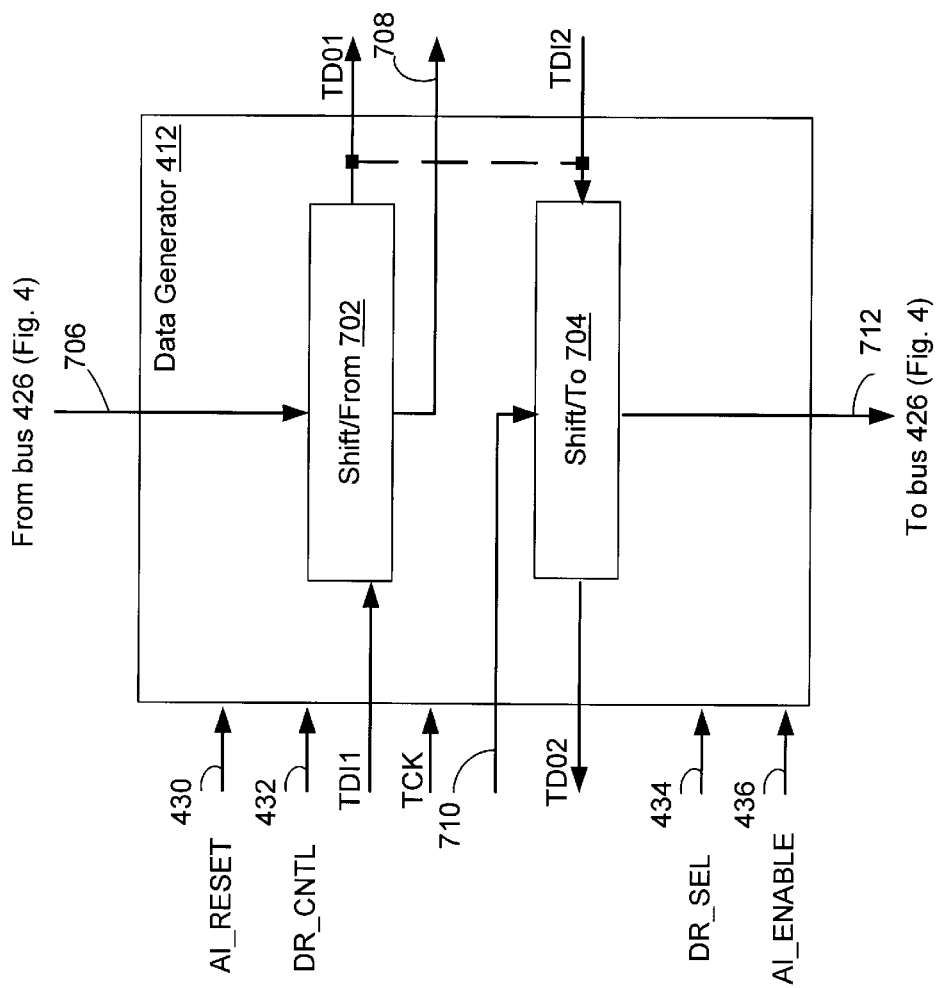
FIG. 7 is a block diagram depicting an alternative embodiment of the data generator of FIG. 6.

FIGS. 6 and 7 depict block diagrams of illustrative embodiments of the data generator 412. As depicted in FIG. 6, the data generator 412 includes the register 601 comprising the register 602 for performing Shift/Capture operations and the register 604 for performing Update operations. In a preferred embodiment, both the registers 602 and 604 include as many cells as there are data inputs and outputs in, e.g., the circuits 208 and 210. For example, the data generator 412 may include a plurality of registers such as the register 601.

Instructions loaded into the IR 404 are used to generate (1) the DR_SEL signals for selecting a register in the data generator 412, e.g., the register 601, and (2) the AI_ENABLE signal for enabling operation of the access interface 206 including the data generator 412. Further, the modified TAP Controller 402 generates (1) the AI_RESET signal for resetting the access interface 206, and (2) the DR_CNTL signals for controlling the Shift/Capture/Update operations of the selected register. It should be understood that the manner in which the registers of the data generator 412 are enabled, selected, re-set, and controlled is conventional.

In addition, the register 602 shifts-in data at the TDI pin and shifts-out data on the TDO pin. Further, the timing of the Shift/Capture/Update operations performed by the register 601 are synchronized with either the TCK clock or with a system clock of the circuit 208 or 210.

Specifically, the register 601 can be used for accessing data portions of the circuits 208 and 210 using simple register operations. For example, the register 602 may capture data from the circuits 208 and 210, and the register 604 may update data to the circuits 208 and 210. The Capture operation may be performed following an access sequence that causes the circuit 208 or 210 to output data onto parallel inputs 606 of the register 602. That data can then be latched into the register 602 during, e.g., the Update1/Capture1-DR 538 state of the access interface branch 505 (see FIG. 5). Next, that data can be serially shifted-out to the TDO pin during, e.g., the Access2-DR 540 state, so that it can be observed. Further, the Update operation may be performed by first serially shifting data into the register 602 during, e.g., the Access1-DR 536 state, thereby loading the register 602. When the Shift operation has completed, that data can be moved in parallel to the register 604 during, e.g., the Update1/Capture1-DR 538 state, for subsequent output to the circuit 208 or 210 via parallel outputs 610.

As depicted in FIG. 7, the data generator 412 alternatively includes at least two (2) separate registers connectable to the circuits 208 and 210, e.g., the register 702 for receiving data from the circuits 208 and 210 on parallel inputs 706 and outputting data to the circuits 208 and 210 on parallel outputs 708, and the register 704 for receiving data from the circuits 208 and 210 on parallel inputs 710 and for outputting data to the circuits 208 and 210 on parallel outputs 712. Specifically, the two (2) registers 702 and 704 are on separate scan paths. The register 702 is scanned using a first pair of TDI_1-TDO_1 pins; and, the register 704 is scanned using a second pair of TDI_2-TDO_2 pins. It should be understood that the manner in which the registers of the data generator 412 are enabled using the AI_ENABLE signal, selected using the DR_SEL signals, re-set using the AI_RESET signal, and controlled using the DR_CNTL signals is conventional.

Figure 8:
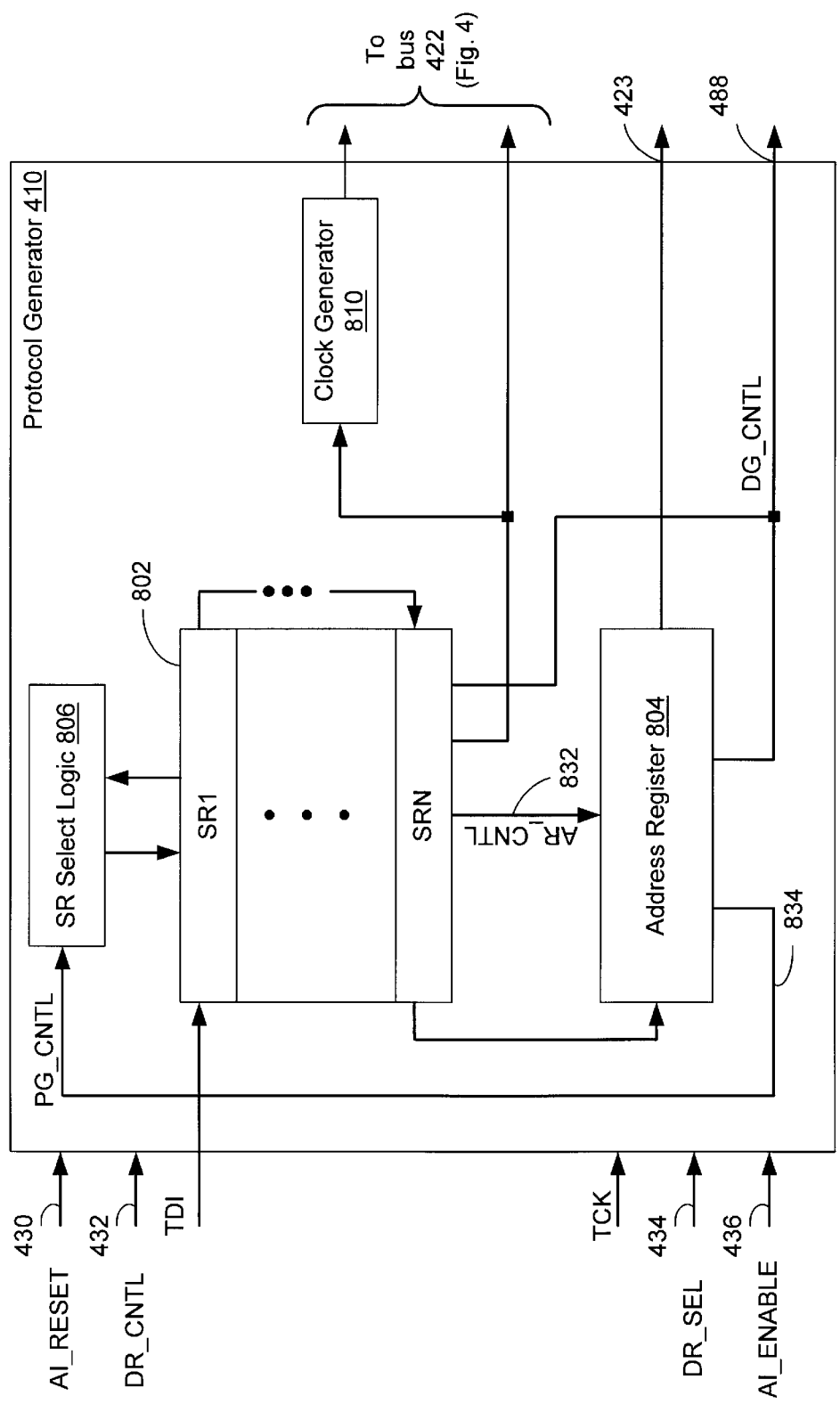
FIG. 8 is a block diagram depicting a protocol generator included in the access interface of FIG. 4.

FIG. 8 shows a block diagram of an illustrative embodiment of the protocol generator 410. Specifically, the protocol generator 410 includes the sequence generator 802 and the address register 804. The sequence generator 802 provides a programmable way of applying a particular access protocol to the circuit 208 or 210; and, the address register 804 provides a programmable way of applying a sequence of addresses to the circuit 208 or 210.

The sequence register 802 includes a scannable control queue comprising the registers SR1 through SRN, which can apply logic levels directly (i.e., in parallel) to control inputs of the circuit 208 or 210 via the bus 422. Alternatively, the control queue contents may control or be decoded by additional logic within the protocol generator 410 to provide control signals to the circuit 208 or 210. For example, the additional logic may include a clock generator 810, which outputs a CLOCK signal on the bus 422. The clock generator 810 may be used, e.g., to provide an access clock such as the TCK clock or a system clock to the connected circuit 208 or 210. Accordingly, the clock generator 810 may include divider circuitry for setting a specific clock rate, or a pulse-width shaping circuit for accessing asynchronous memories using a clock that is synchronous to the access interface 206. During operation of the access interface 206, this additional logic may synchronize with the TCK clock or the system clock to allow it to operate at the system speed of the circuit 208 or 210.

In this illustrative embodiment, the control queue of the sequence register 802 is N-registers deep by M-bits wide. For example, the N-register deep control queue may be configured to support the maximum length protocol sequence to be applied to the circuit 208 or 210. These N control queue locations are depicted in FIG. 8 as SR1 through SRN.

Specifically, during operation of the access interface 206 (i.e., while AI_ENABLE is high), the N control queue locations are successively accessed and their contents used to sequence the control signals of the circuit 208 or 210 via the bus 422, and to control sequencing of the data generator 412 using DG_CNTL signals on a bus 488 (see also FIG. 4). Accordingly, each control queue location SR1 through SRN holds values for a single control state of the circuit 208 or 210 along with corresponding control states of the data generator 412.

In addition, when operation of the access interface 206 is disabled (i.e., AI_ENABLE is low), the contents of the registers SR1 through SRN can be scanned. Accordingly, the sequence register 802 can be programmed to set initial contents of the registers SR1 through SRN before enabling the access interface 206.

The programmability of the protocol generator 410 permits (1) the sequence length of the access protocol to vary, e.g., from 1 control sequence up to the maximum queue depth of N, and (2) the access protocol to be repetitively applied without re-scanning the contents of the registers SR1 through SRN. Consequently, the sequence register 802 can apply various sequences of control signals in accordance with required circuit access protocols.

As mentioned above, the control queue locations SR1 through SRN also contain levels for controlling the access interface 206. As depicted in FIG. 8, the sequence register 802 provides AR_CNTL signals to the address register 804 via a bus 832, which may be used to select or control a particular address sequence generated by the address register 804. The sequence register 802 also provides the DG_CNTL signals to the data generator 412 on the bus 830, which may be similarly used to select or control a particular data sequence generated by the data generator 412.

The execution of the sequence register 802 is controlled by SR select logic 806 (see FIG. 8), which provides control signals to the sequence register 802. For example, the SR select logic 806 may be programmed via scan initialization to vary the control queue depth from 1 to N. In a preferred embodiment, when the control queue depth is programmed to be less than N, upper control queue locations are not included in the access protocol sequence. The execution of the sequence register 802 starts based upon an instruction loaded in the IR 404, which causes the DR_SEL and AI_ENABLE signals to be appropriately asserted. During the execution of the sequence register 802, the SR Select Logic 806 may either stop sequencing the sequence register 802 after the programmed number of locations have been executed, or repeat that sequence until stopped by the modified TAP Controller 402.

As mentioned above, the address register 804 provides address sequences to the circuit 208 or 210 via the bus 423. For example, if the circuit 208 or 210 includes a memory circuit, then the address register 804 may provide address sequences directly (i.e., in parallel) to the memory circuit instead of providing the address sequences via a scan register. As a result, the protocol generator 410 can access memories without having to perform a scan operation each time a new memory location is to be accessed.

The address register 804 includes one or more address generation circuits. For example, these circuits may include up/down counters or pseudo-random sequence generators such as an LFSR. Further, each address generation circuit may comprise a separate address register within the address register 804. The address register 804 also includes conventional control circuitry for the address generation circuits, e.g., to select an up or down count sequence. The address register 804 can therefore be configured to support different access sequences for different types of memories. For example, the address register 804 may provide multiple address sequences to support the programming, testing, and debugging of multi-ported memories.

As also mentioned above, the address register 804 receives control inputs from the sequence register 802 via the AR_CNTL signals. For example, the AR_CNTL signals may come directly from the sequence register 802 queue or may alternatively be decoded by the address register 804. Further, the AR_CNTL signals may be used to direct one of the address generation circuits to advance to a next memory address. The address register 804 can also control the SR Select Logic 806 via PG_CNTL signals on a bus 834 and control the data generator 412 via the DG_CNTL signals on the bus 488, thereby allowing values or conditional events included in address sequences to control both protocol and data generation in the access interface 206.

In this illustrative embodiment, the sequence register 802 is scannable; and, the address register 804 and the registers SR1 through SRN are included in the same scan path, which is connected between the TDI and the TDO pins. Accordingly, the address register 804 can be scanned along with the sequence register 802. Scanning the address register 804 allows its address register contents and any control logic included therein to be initialized before enabling the access interface 206.

The length of the scan chain including the registers SR1 through SRN and address register 804 depends upon specific configurations of the address register 804 and the control queue of the sequence register 802. In this exemplary embodiment, the sequence register 802 has a length of (N×M) bits, and the address register 804 has a length totaling all of the lengths of the address registers included therein.

In an alternate embodiment, the sequence register 802 and the address register 804 are partitioned so as to be on more than one scan path within the protocol generator 410. For example, the (N×M) bits of the sequence register 802 may be on one scan path, and each register of the address register 804 may be on separate scan paths. In this alternate embodiment, the protocol generator 410 may have multiple pairs of TDI-TDO pins. It should be understood that the manner in which the registers SR1 through SRN and the address register 804 are enabled using the AI_ENABLE signal, selected using the DR_SEL signals, re-set using the AI_RESET signal, and controlled using the DR_CNTL signals is conventional.

Figure 9:
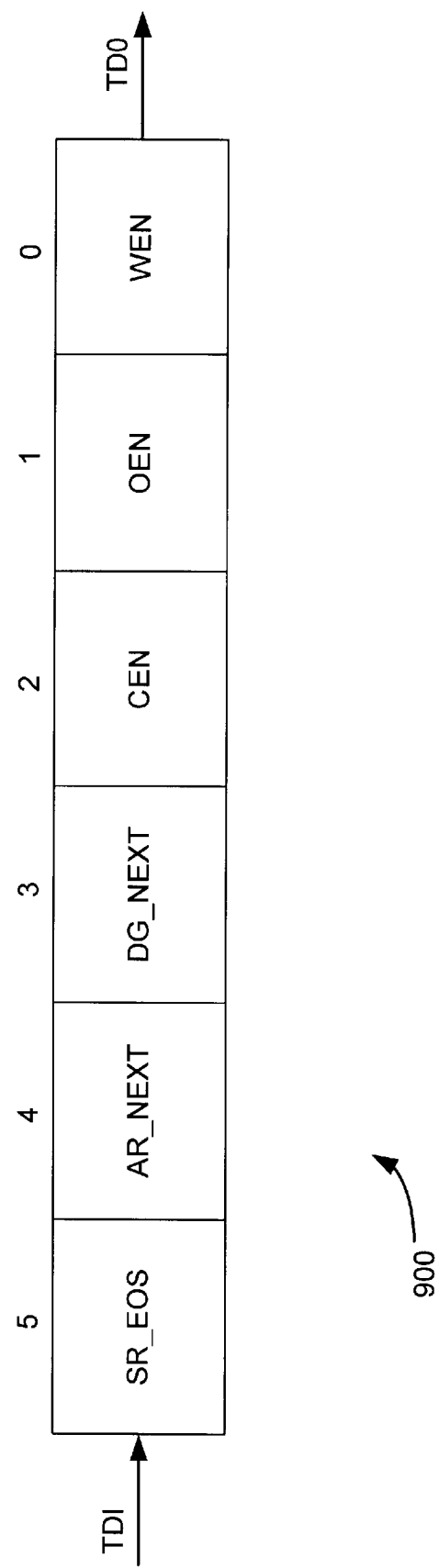
FIG. 9 is a plan view of a protocol register included in the protocol generator of FIG. 8.

FIG. 9 depicts an illustrative embodiment of a control queue location 900 included in the sequence register 802. The queue location 900 indicates various control field/bit assignments that are representative of the control required to program, test, or debug, e.g., an asynchronous SRAM device on a PCB or embedded in an IC.

The three most significant bits (MSBs), i.e., bits 3 through 5, are used to control logic within the protocol generator 410. Specifically, MSB 5 (SR_EOS) is used to indicate that this SR location is the end of the protocol sequence by signaling the SR Select Logic 806 to stop the control queue sequencing at this point. Further, bit 4 (AR_Next) is used to direct the address register 804 to advance to a next memory address; and, bit 3 (DG_Next) is used to direct the data generator 412 to generate a next data pattern, e.g., a foreground or background data pattern in the case of a memory BIST application.

As depicted in FIG. 9, the three least significant bits (LSBs) of the queue location 900 are control signals that can be directly applied to the circuit 208 or 210. For example, the circuit 208 or 210 may comprise an SRAM. Accordingly, bit 2 (CEN) is a chip enable signal, bit 1 (OEN) is an output enable signal, and LSB 0 (WEN) is a write enable signal for the exemplary SRAM device. By setting values for CEN, OEN and WEN in respective control queue locations, the access sequence for the SRAM can be programmed to perform, e.g., a read operation, a write operation, a read followed by a write operation, etc.

FIG. 9 depicts the TDI and TDO pin connections relative to the single queue location 900. In this illustrative embodiment, these TDI and TDO pin connections are chained from one queue location to the next for the entire sequence register 802 to place the registers SR1 through SRN on the same scan path.

In one embodiment, the queue location 900 may be shared and used to access other circuits in addition to the SRAM mentioned above. Because the sequence register 802 is programmable, the control queue bits can be redefined to accommodate requirements of the multiple circuits. Further, additional control queue bits may be defined if needed, e.g., when certain control bits are used with one circuit and unused for another circuit.

Accordingly, the protocol generator 802 and the data generator 804 can be configured to support any circuit coupled to the access interface 206. For example, the access interface 206 may be connected and dedicated to a single circuit, or it may be implemented such that it is shared to provide access to a plurality of connected circuits such as the circuits 208 and 210. The access interface 206 may also be partitioned among a plurality of circuits and/or devices. For example, the data generator 412 may be shared between a group of memories while using separate protocol generators 802, each one dedicated for use with a respective memory. This would allow, e.g., a different BIST algorithm for each memory to be programmed in corresponding protocol generators, and the different BIST algorithms to be executed concurrently using the access interface 206.

Alternatively, a plurality of access interfaces may operate in parallel from a single TAP Controller 402, or a single access interface may be partitioned across multiple ICs and synchronized to run from multiple TAP controllers 402. For example, this configuration may be used when an external memory structure is connected to multiple ASICs on a PCB, with a first ASIC controlling a memory data bus and a second ASIC providing address and control signals to the memories. In this application, the access interface 206 may be partitioned so that the data generator 412 is implemented in the first ASIC and the protocol generator 410 is implemented in the second ASIC. Each ASIC would then have a TAP Controller that would be used to run the access interface 206 partitioned across the two ASICs.

The embodiments disclosed herein will be better understood with reference to the following illustrative examples. In a first illustrative example, a memory circuit having 8-bits of input data and 8-bits of output data is connected to the access interface 206, which accesses this memory circuit using the data generator 412, as depicted in FIG. 6. Specifically, the data generator 412 is implemented as dedicated logic using eight (8) BSR-type cells, and therefore has a scan length of 8-bits. In this first illustrative example, a Capture operation is used during memory read operations to capture data read from the memory into the data generator 412 on the inputs 606. The test resource 204 (see FIG. 2) then scans the 8-bits of captured data, which is read out of the data generator 412 on the TDO pin of the device, to observe the accessed memory data. Similarly, memory write data may be scanned into the data generator 412; and, following an Update operation, a programmed access sequence of the protocol generator 410 may write this byte of data to the memory on the outputs 610.

Figure 12:
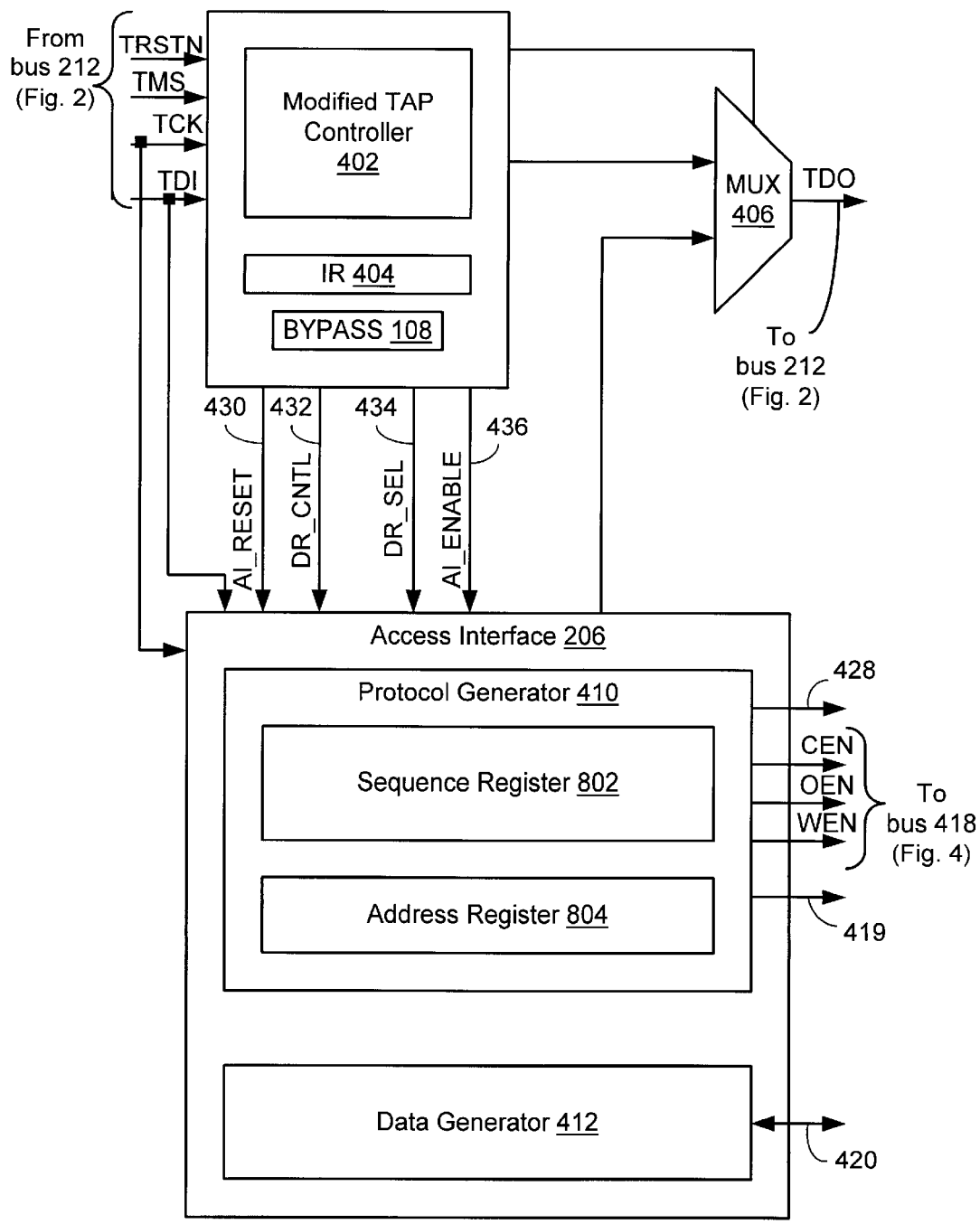
FIG. 12 is a block diagram depicting the access interface and the controller of FIG. 4 configured to access electrical nodes of parallel memory circuits.

In a second illustrative example, the access interface 206 of FIG. 12 is used to access an external SRAM memory device. For example, the circuitry depicted in FIG. 12 may be implemented inside an ASIC or programmed in an FPGA, and that device may be connected to the external SRAM on a PCB.

The access interface 206 of FIG. 12 includes the sequence register 802, the address register 804, and the data generator 412. In this second illustrative example, the multiplexors 414, 415, and 416 that select between the normal system signals and the signals generated by the access interface 206 are not explicitly shown. Specifically, the multiplexors 414, 415, and 416 are implemented with logic external to the access interface 206 but inside the same device containing the TAP Controller 402 and the access interface 206. The access interface 206 provides a signal on the lines 428 to select between the signals at the inputs of the multiplexors 414, 415, and 416. The access interface 206 also provides ADDRESS signals on the bus 419, and a set of CONTROL signals, i.e., CEN, OEN and WEN, on the bus 418. These control signals are the same as those indicated in bits 0 through 2 of the queue location 900 (see FIG. 9). Data passing between the external SRAM and the data generator 412 on the bus 420 are also depicted in FIG. 12. All of the signals transmitted to and received from the memory are selected at the multiplexors 414, 415, and 416. These signals will be selected and connected to corresponding data, address, and control terminals of the SRAM during operation of the access interface 206.

Figure 13:
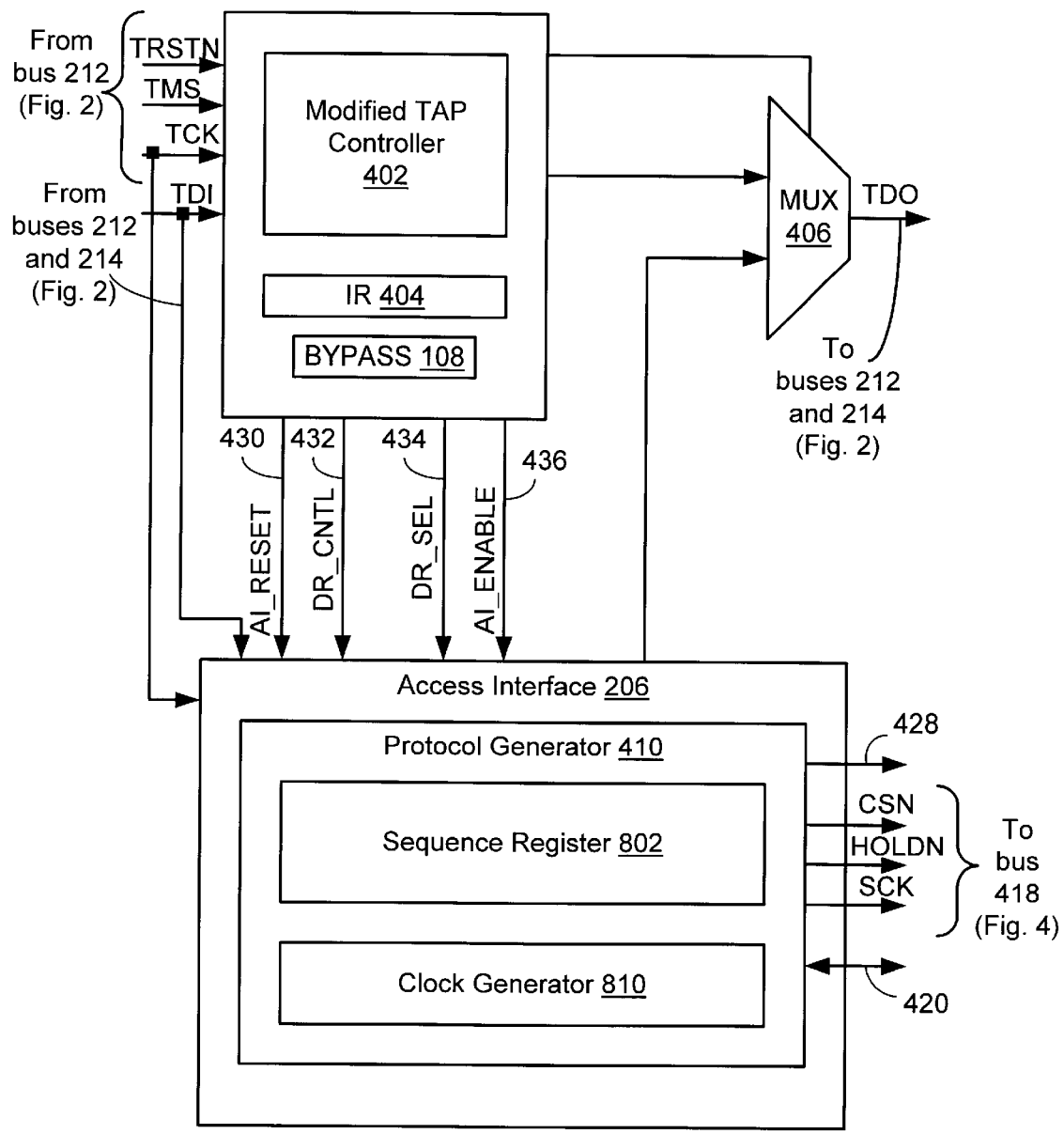
FIG. 13 is a block diagram depicting the access interface and the controller of FIG. 4 configured to access electrical nodes of serial memory circuits.

In a third illustrative example, the access interface 206 of FIG. 13 is used to access a serial EEPROM device. The circuitry depicted in FIG. 13 may also be implemented inside an ASIC or programmed in an FPGA, and that device may be connected to the serial EEPROM device on a PCB.

The TAP Controller 402 of FIG. 13 is identical to that of FIG. 12. However, in this example the scan logic has been adapted for accessing the serial EEPROM device. Further, the access interface 206 of FIG. 13 shows only the sequence register 802 and the clock generator 810. The address register 804 and the data generator 412 are not explicitly shown because in this example they are not required for accessing the serial EEPROM device.

As in the SRAM example relating to FIG. 12, the access interface 206 generates control signals, i.e., CSN, HOLDN, and SCK, on the bus 418 to the serial EEPROM device. These signals enable chip operations and provide for clocking of the serial EEPROM device. The access interface 206 of FIG. 13 also provides select signals on the lines 428, as in the second illustrative example. However, address and data signals for reading from and writing to the memory are accessed as a specific serial I/O protocol via the TDI-TDO pins, which in this illustrative example are coupled to both of the buses 212 and 214. Because the serial I/O protocol may be sent directly via the TDI-TDO pins, the address register 804 and the data generator 412 are not needed. The serial I/O protocol will vary depending on the size of the serial EEPROM device connected to the access interface 206. For example, for smaller devices the serial address may be 10-bits long, and for larger devices up to 17-bits of serial address may be provided. The clock generator 810 of FIG. 13 provides an access clock signal, SCK, which is divided down from the TCK clock. A programmable clock divider circuit is provided within the clock generator 810 to accommodate a variety of SCK clock frequencies.

Figure 10:
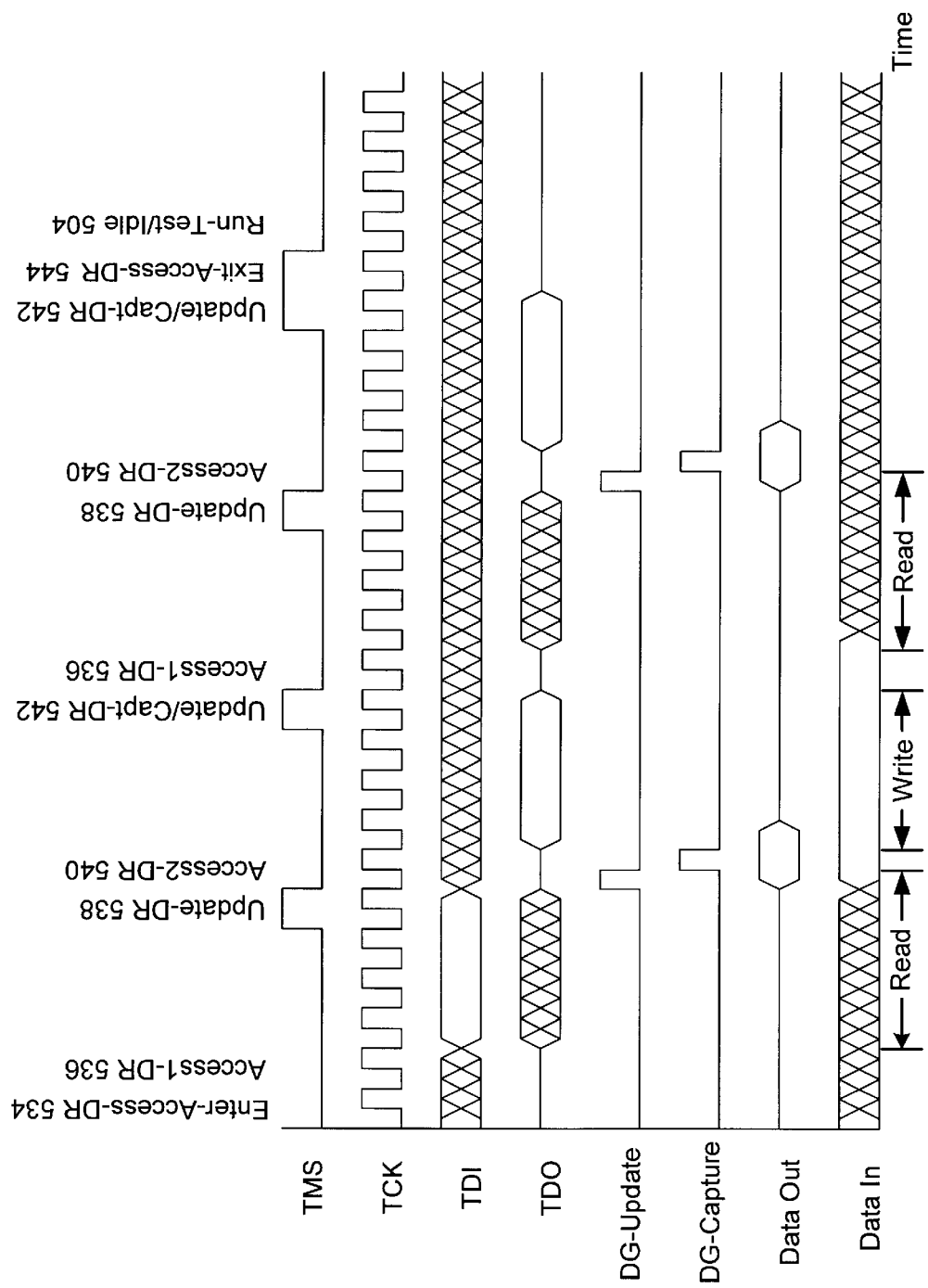
FIG. 10 is a timing diagram depicting a first operational sequence of the access interface and the controller of FIG. 4.
Figure 14:
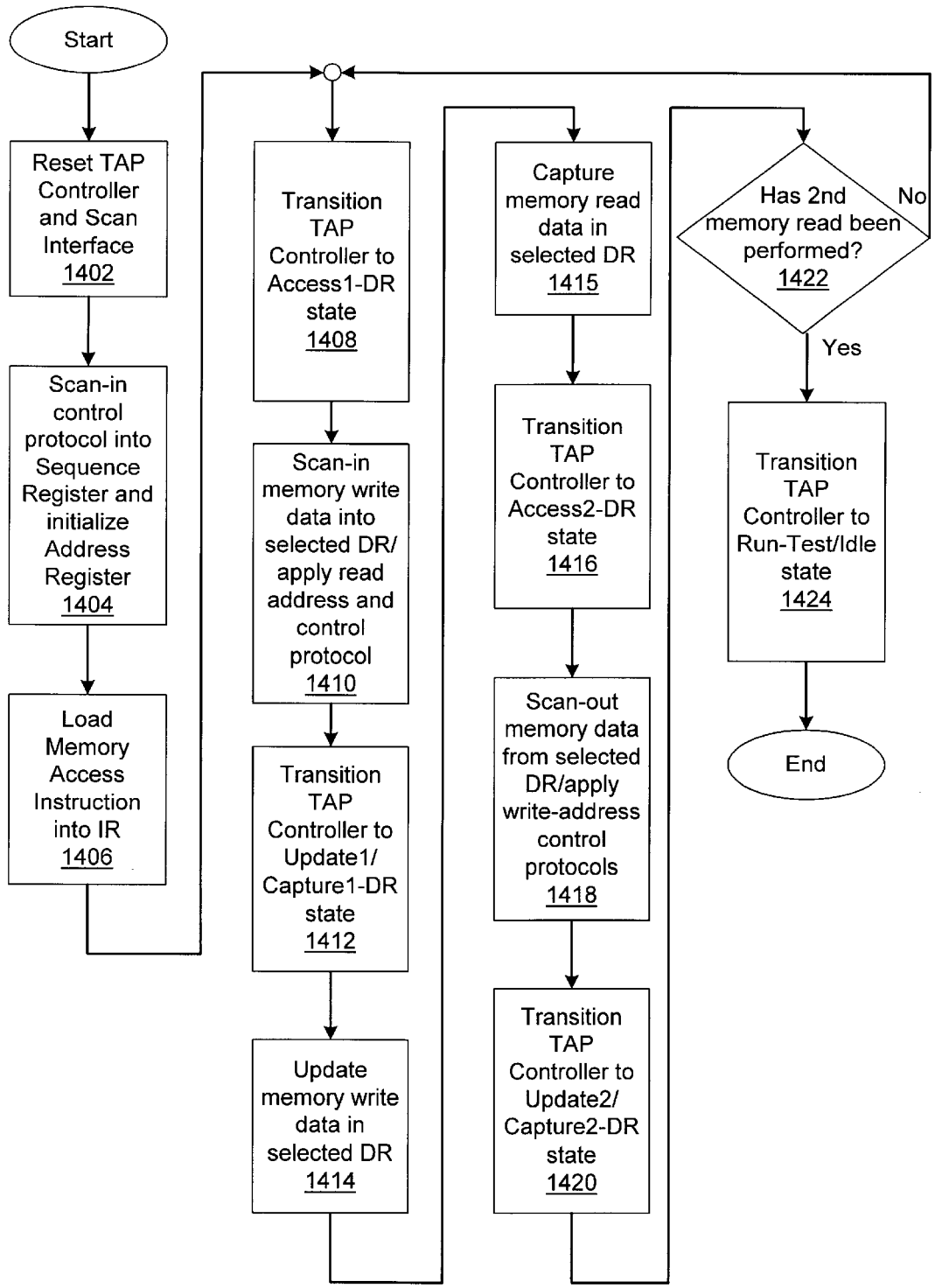
FIG. 14 is a flow diagram depicting a first exemplary method of operation for the access interface and the controller of FIG. 4.

A first method of operation of the access interface 206 is illustrated by reference to FIGS. 10 and 14. Specifically, the timing diagram of FIG. 10 and the flow diagram of FIG. 14 depict the timing and software flow, respectively, for a typical series of memory access operations, e.g., a read operation, immediately followed by a write operation, and immediately followed by another read operation. Before the memory access operations are performed, the access interface 206 is initialized as follows. First, the modified TAP Controller 402 is reset, as depicted in step 1402 (see FIG. 14), thereby placing the modified TAP Controller 402 in the Test-Logic-Reset 502 state. This also causes the AI_RESET signal to be asserted, thereby resetting the access interface 206. Next, as depicted in step 1404, a Shift instruction is loaded into the IR 404 for use in scanning in via the TDI pin a suitable read/write/read control protocol into the sequence register 802 and initializing the address register 804 with a starting address. A memory access instruction is then loaded, as depicted in step 1406, into the IR 404 to assert the AI_ENABLE signal, program the Access1-DR 536 state to perform a Shift operation, program the Update1/Capture1-DR 538 state to perform an Update operation and a Capture operation, program the Access2-DR 540 state to perform a Shift operation, program the Update2/Capture2-DR 542 state to inhibit both the Update and Capture operations, and select a register in the data generator 412. Next, the level of TMS is set to logical 0, as depicted in step 1408, to transition the modified TAP Controller 402 FSM first to the Enter-Access-DR 534 state and then to the Access1-DR 536 state (see FIGS. 5 and 10). Scan-in data is then shifted, as depicted in step 1410, via the bus 420 into the selected register of the data generator 412 from the memory location pointed to by the starting address; and, a first read control sequence is concurrently applied, as also depicted in step 1410, via the bus 418 to the memory circuit connected to the access interface 206. As depicted in the timing diagram of FIG. 10, four (4) cycles of the TCK clock occur during the first read operation to shift four (4) bits of data into the selected register of the data generator 412 from the memory circuit. The level of TMS is then set, as depicted in step 1412, to logical 1 to transition the modified TAP Controller 402 FSM to the Update1/Capture1-DR 538 state (see FIGS. 5 and 10). Next, the shifted data is updated, as depicted in step 1414, in the selected register so that it can be written to the memory circuit in the next access sequence. It should be noted that the initial scan-out data, which was shifted-out of the data generator 412 at the TDO pin, is unknown data and may be discarded. Next, previously read data is captured, as depicted in step 1415, in the selected register via the bus 420 from the memory circuit. Such previously read data is subsequently shifted out of the data generator 412 via the bus 212. The level of TMS is then set to logical 0, as depicted in step 1416, to transition the modified TAP Controller 402 FSM to the Access2-DR 540 state (see FIGS. 5 and 10). Next, the data in the selected register is shifted, as depicted in step 1418, out of the data generator 412 via the bus 420 to the memory; and, the protocol generator 410 concurrently applies, as also depicted in step 1418, a write control sequence via the bus 418 to the memory and an address control sequence via the AR_CNTL signals to the address register 804 to increment the stored address. The level of TMS is then set to logical 1, as depicted in step 1420, to transition the modified TAP Controller 402 FSM to the Update2/Capture2-DR 542 state (see FIGS. 5 and 10), thereby ending the write operation. Next, a decision is made, as depicted in step 1422, as to whether the second memory read sequence has been performed. If not, then the method loops back to step 1408, thereby starting the second memory read sequence. Otherwise, the level of TMS is set to logical 1 and then to logical 0, as depicted in step 1424, to transition the modified TAP Controller 402 FSM first to the Exit-Access-DR 544 state and then to the Run-Test/Idle 504 state (see FIGS. 5 and 10), thereby ending the read/write/read sequence. It should be noted that the above-described method may be suitably modified for performing any desired number of memory read/write operations.

Figure 11:
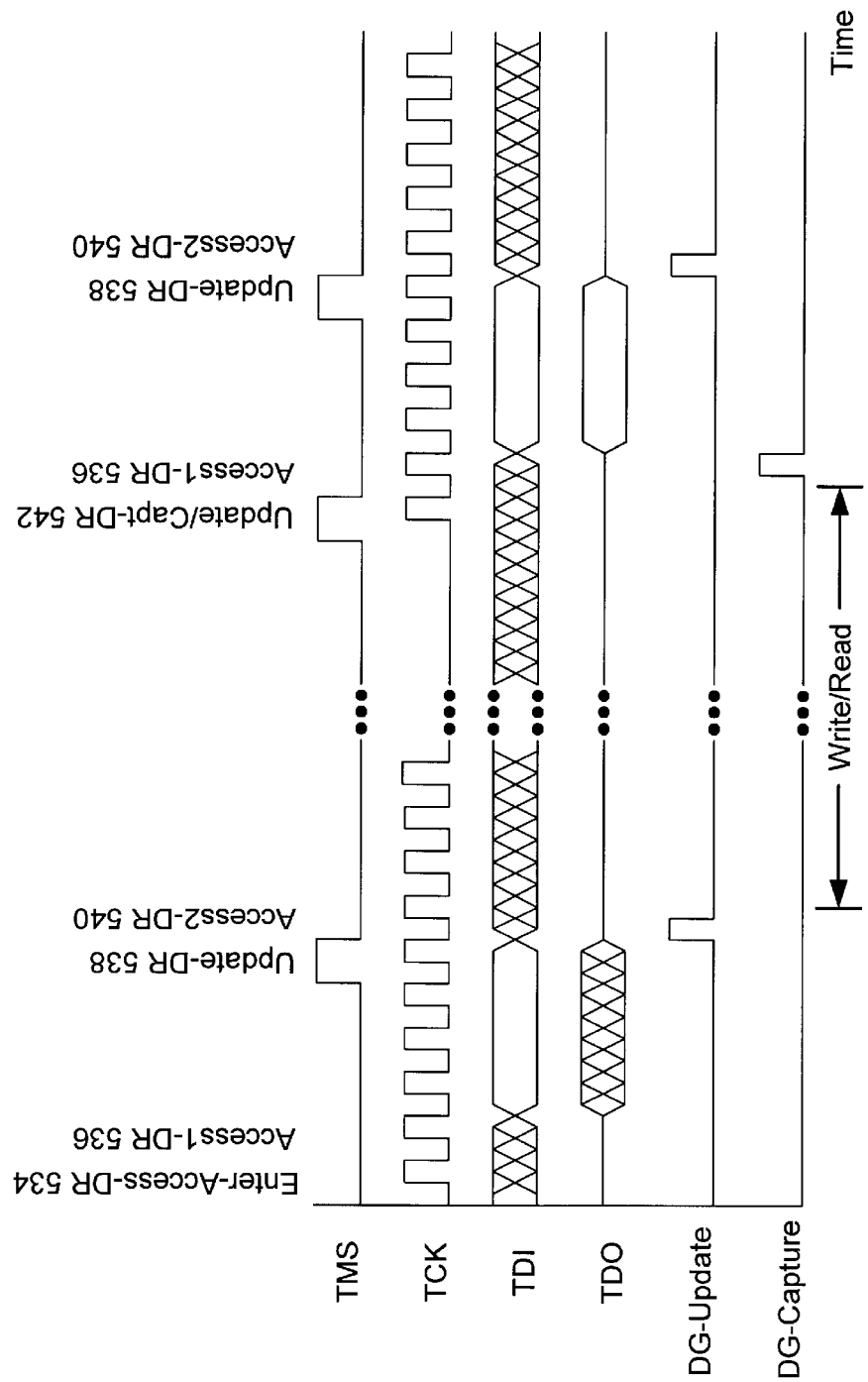
FIG. 11 is a timing diagram depicting a second operational sequence of the access interface and the controller of FIG. 4.
Figure 15:
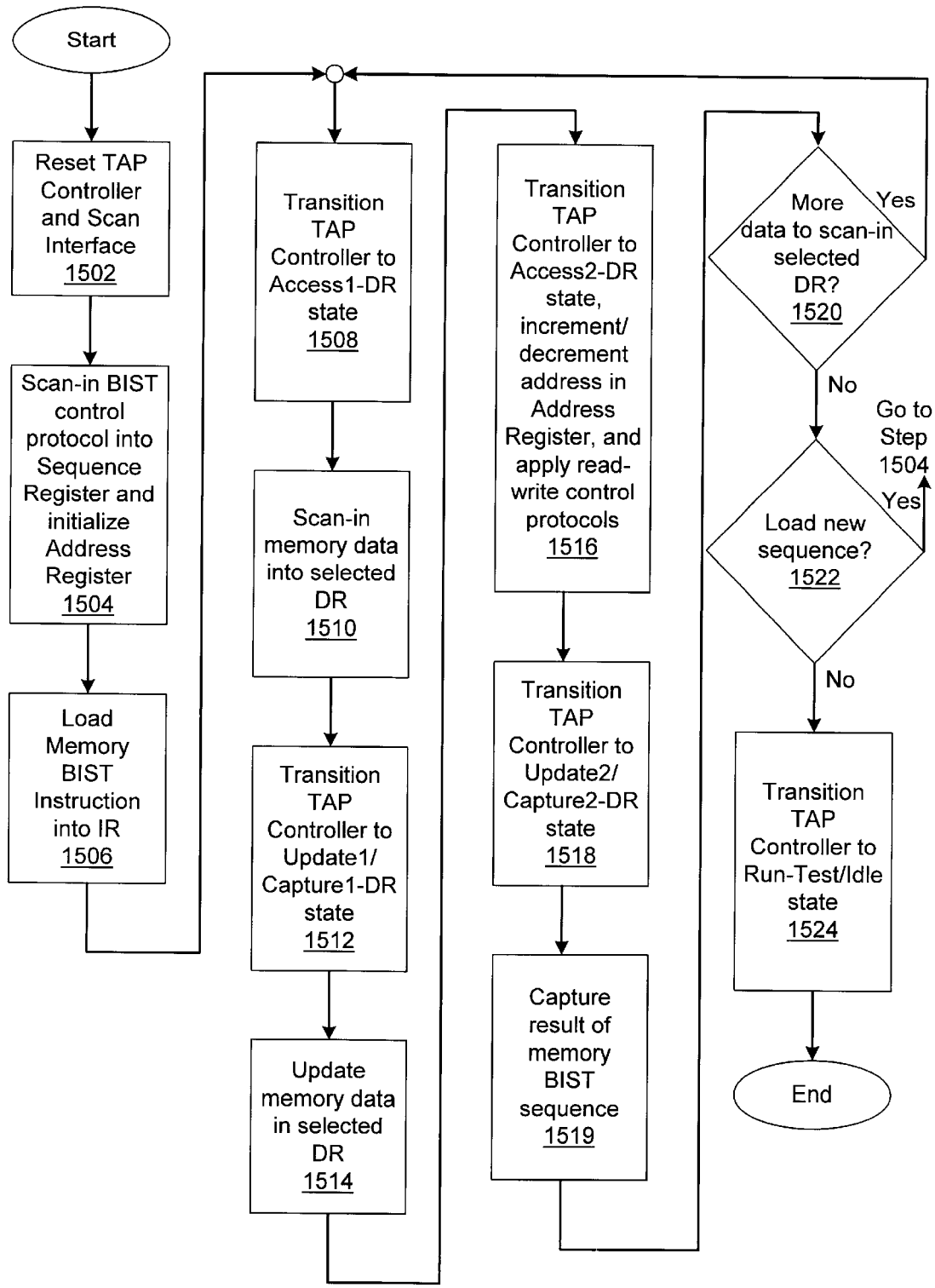
FIG. 15 is a flow diagram depicting a second exemplary method of operation for the access interface and the controller of FIG. 4.

A second method of operation of the access interface 206 is illustrated by reference to FIGS. 11 and 15. Specifically, the timing diagram of FIG. 11 and the flow diagram of FIG. 15 depict the timing and software flow, respectively, for a memory access sequence that scans in an initial data value into the data generator 412, executes a control protocol sequence using the control queue of the sequence register 802 that repeatedly executes a sequence of memory read/write operations, and finally scans out a data result using the data generator 412. This exemplary sequence may be used to execute a memory BIST algorithm. First, the modified TAP Controller 402 is reset, as depicted in step 1502 (see FIG. 15), to place the modified TAP Controller 402 in the Test-Logic-Reset 502 state. This also causes the AI_RESET signal to be asserted, thereby resetting the access interface 206. Next, a Shift instruction is loaded, as depicted in step 1504, into the IR 404 for use in loading the control queue of the sequence register 802 with the BIST control protocol and initializing the address register 804 with a starting address. A memory BIST instruction is then loaded, as depicted in step 1506, into the IR 404 to set the AI_ENABLE signal high, program the Access1-DR 536 state to perform a Shift operation, program the Update1/Capture1-DR 538 state to perform an Update operation, program the Access2-DR 540 to perform a memory BIST sequence, program the Update2/

Capture2-DR 542 state to perform a Capture operation, and select a register in the data generator 412. The memory BIST sequence performed by the Access2-DR 540 will be described in detail below. Next, the level of TMS is set to logical 0, as depicted in step 1508, to transition the modified TAP Controller 402 FSM first to the Enter-Access-DR 534 state and then to the Access1-DR 536 state (see FIGS. 5 and 11). Scan-in data is then shifted, as depicted in step 1510, via the TDI pin into the selected register of the data generator 412 for use in initializing the register for a first BIST sequence. It should be noted that in this exemplary method, a memory control sequence does not start concurrently with the data generator 412 Shift operation. Next, the level of TMS is set to logical 1, as depicted in step 1512, to transition the modified TAP Controller 402 FSM to the Update1/Capture1-DR 538 state (see FIGS. 5 and 11). The shifted data is then updated, as depicted in step 1514, in the selected register. Next, the level of TMS is then set to logical 0, as depicted in step 1516, to transition the modified TAP Controller 402 FSM to the Access2-DR 540 state (see FIGS. 5 and 11) to execute the memory BIST sequence. This may take many cycles of the TCK clock to complete. Specifically, in a typical memory BIST sequence, the data stored in the selected register is written to a memory location, read back from that location, and then written to and read back from successive memory locations until the test is completed. Accordingly, the address stored in the address register 804 is suitably incremented (or decremented), as further depicted in step 1516, and the sequence register 802 is sequenced and looped, as still further depicted in step 1516, on memory read/write commands based upon the programming performed in steps 1504 and 1506. Next, the level of TMS is set to logical 1, as depicted in step 1518, to transition the modified TAP Controller 402 FSM to the Update2/Capture2-DR 542 state. The result of the memory BIST sequence is then captured, as depicted in step 1519, in the selected register (see FIGS. 5 and 10). A decision is then made, as depicted in step 1520, as to whether there is any more data to scan into the selected register of the data generator 412. If so, then the method loops back to step 1508. As depicted in FIG. 11, there is valid data at both the TDI and TDO pins during the subsequent execution of the step 1510. The valid TDO data is the result of the first memory BIST sequence, and the valid TDI data is new scan data to be used in a next memory BIST sequence. Otherwise, if there is no more data to be scanned into the data generator 412, then another decision is made, as depicted in step 1522, as to whether the control queue of the sequence register 802 is to be loaded with another BIST control protocol. If so, then the method loops back to step 1504. Otherwise, the level of TMS is first set to logical 1 and then to logical 0, as depicted in step 1524, to transition the modified TAP Controller 402 FSM first to the Exit-Access-DR 544 state and then to the Run-Test/Idle 504 state (see FIG. 5), thereby ending the memory BIST sequence. In this exemplary method, the memory BIST sequence may be repeated with new data in the selected register, or the modified TAP Controller 402 FSM may transition to the Exit-Access-DR 544 state and the sequence register 802 and the address register 804 re-initialized to start a new memory BIST sequence.

Having described the above illustrative embodiments, other alternative embodiments or variations may be made. Specifically, FIGS. 6 and 7 depict two (2) representative implementations of the data generator 412. However, the access interface 206 is intended to support many different implementations of the data generator 412, depending upon the specific application, e.g., programming, testing, or debugging, and the design and type of circuit connected to it.

Specifically, it was mentioned above that it is possible for the data generator 412 to operate as a pattern generator, a comparator, or a signature register in order to support BIST of a circuit coupled to the access interface 206. For example, in a BIST implementation of the data generator 412, the Shift/From register 702 (see FIG. 7) may be designed to function as an MISR and the Shift/To register 704 (see FIG. 7) may be designed to function as an LFSR. Further, although two (2) separate scan paths are shown in FIG. 7, these scan paths may be connected to form a single scan path as depicted in FIG. 7 by the dashed line connecting TDO_1 and TDI_2. In this application, the TDO_1 output and TDI_2 input are not included in the data generator 412, and there is only a single TDI-TDO path, as depicted in FIG. 6.

It should also be noted that the data generator 412 allows for asymmetrical data to be sent to and received from the connected circuit. For example, the single register data generator 412, as depicted in FIG. 6, may be connected to a circuit in which the number of outputs is not equal to the number of inputs. In this application, the shift-out/shift-in data for Capture and Update operations may be appropriately "padded" or masked.

In addition, it was described that the TAP Controller 402 is preferably a modified TAP Controller that not only includes the standard Select-DR and Select-IR branches 501 and 503, but also includes a new access interface branch 505 with states for implementing operations using the access interface 206. However, this was merely an illustrative example. The TAP Controller 402 FSM may alternatively consist of the standard FSM, as depicted in FIG. 3. The access interface 206 may therefore optionally include decode logic 490 (see FIG. 4) for decoding the states included in the access interface branch 505. Specifically, the decode logic 490 receives the standard FSM states and the logic level on the TMS pin as inputs; and, provides DR_CNTL2 signals in place of the DR_CNTL signals to control register operations.

Those of ordinary skill in this art will also appreciate that variations to and modification of the above-described apparatus and method for accessing electrical nodes of electronic circuits may be made without departing from the inventive concepts disclosed herein. Accordingly, the present invention should be viewed as limited solely by the scope and spirit of the appended claims.

What is claimed is:

1. An access controller for accessing an electronic circuit, comprising:

a scan input terminal;

a scan output terminal;

a parallel access bus communicably coupleable to at least one functional I/O of the electronic circuit;

an address bus communicably coupleable to at least one address input of the electronic circuit;

a parallel control bus communicably coupleable to at least one control input of the electronic circuit;

at least one data register having a serial input coupled to the scan input terminal for scanning input data into the data register, a plurality of data terminals coupled to the parallel access bus for providing in parallel the input data to the functional I/O and for receiving in parallel output data from the functional I/O of the electronic circuit, and a serial output coupled to the scan output terminal for scanning the output data out of the data register;

at least one address register having a serial input coupled to the scan input terminal for scanning at least one address sequence into the address register, the address register being configured to provide in parallel the address sequence to the address input of the electronic circuit over the address bus; and a protocol generator coupled to the parallel control bus, the protocol generator including at least one control register for providing in parallel at least one functional control sequence to the control input of the electronic circuit over the parallel control bus, wherein the data register, the address register, and the protocol generator are configured to operate substantially concurrently to enable testing, debugging, or programmable configuration of the electronic circuit.

2. The access controller of claim 1 wherein the address register comprises an address generator controllable by the protocol generator.

3. The access controller of claim 1 wherein the protocol generator includes a clock generator, the clock generator being configured to provide at least one clock signal to the electronic circuit over the parallel control bus.

4. The access controller of claim 1 wherein the data register comprises a data pattern generator.

5. The access controller of claim 1 wherein the data register comprises a data comparator.

6. The access controller of claim 1 wherein the data register comprises a signature register.

7. The access controller of claim 1 wherein the protocol generator includes a plurality of control registers configured as a sequenced queue, the sequenced control register queue being coupled between the scan input terminal and the scan output terminal.

8. The access controller of claim 7 wherein the plurality of control registers are serially connectable to one another to form at least one scan path.

9. The access controller of claim 7 wherein the sequenced control register queue has a serial input coupled to the scan input terminal for scanning at least one functional control sequence into the control register queue, and a plurality of control terminals coupled to the parallel control bus for providing in parallel the functional control sequence to the control input of the electronic circuit.

10. The access controller of claim 1 further including a scan controller operatively coupled to the scan input terminal and the scan output terminal, the scan controller being configured to scan at least one of the data register and the address register, and to sequence the protocol generator.

11. The access controller of claim 10 wherein the scan controller is compatible with the protocol of the IEEE 1149.1 standard.

12. The access controller of claim 10 wherein the data register, the address register, and the protocol generator include respective scan paths, and the scan controller includes a state machine operatively connected to the respective scan paths, the state machine having a plurality of states, and wherein the data register, the address register, and the protocol generator are configured to perform operational commands based at least in part on the plurality of states.

13. The access controller of claim 12 wherein at least one of the plurality of states is programmable.

14. The access controller of claim 13 wherein at least one of the plurality of states is programmable to select between a shift-data state and a pause state.

15. The access controller of claim 13 wherein at least one of the plurality of states is programmable to select between an update-data state and a capture-data state.

16. The access controller of claim 13 wherein the plurality of states comprises a variable sequence of programmable states.

17. The access controller of claim 16 wherein the variable sequence of programmable states comprises a shift-data state or a pause state followed by an update-data state or a capture-data state.

18. The access controller of claim 16 wherein the variable sequence of programmable states comprises an update-data state or a capture-data state followed by a shift-data state or a pause state.

19. The access controller of claim 16 wherein the variable sequence of programmable states comprises an update-data state followed by a capture-data state.

20. The access controller of claim 16 wherein the variable sequence of programmable states comprises a capture-data state followed by an update-data state.

21. The access controller of claim 12 wherein the scan controller is configured to perform at least one sequence of programmed states a predetermined number of times.

22. The access controller of claim 1 wherein the scan input terminal and the scan output terminal are operatively coupleable to an independent scan controller, the independent scan controller being configured to scan at least one of the data register and the address register, and to sequence the protocol generator.

23. The access controller of claim 22 wherein the independent scan controller comprises a chip-level IEEE 1149.1 compatible TAP controller.

24. The access controller of claim 1 wherein the access controller is implemented on a chin compatible with the protocol of the IEEE 1149.1 standard, the chip including a boundary scan register, the electronic circuit comprising a FLASH memory coupleable to the IEEE 1149.1 compatible chip, and wherein the data register, the address register, and the protocol generator are configured to operate substantially concurrently to program the FLASH memory without using the boundary scan register.

25. A method of accessing an electronic circuit, comprising the steps of:

providing in parallel input data to at least one functional I/O of the electronic circuit by at least one data register, the data register being included in an access controller operatively coupled to the electronic circuit;

receiving in parallel output data from the functional I/O of the electronic circuit by the data register;

providing in parallel at least one address sequence to at least one address input of the electronic circuit by at least one address register, the address register being included in the access controller; and providing in parallel at least one functional control sequence to at least one control input of the electronic circuit by at least one control register of a protocol generator, the protocol generator being included in the access controller, wherein the first providing step, the receiving step, the second providing step, and the third providing step are performed substantially concurrently to enable testing, debugging, or programmable configuration of the electronic circuit.

26. The method of claim 25 further including the step of providing at least one clock signal to the electronic circuit by a clock generator included in the protocol generator.

27. The method of claim 25 further including the step of scanning at least one of the data register and the address register, and sequencing the protocol generator, by a scan controller included in the access controller.

28. The method of claim 25 further including the step of scanning at least one of the data register and the address register, and sequencing the protocol generator, by an independent scan controller operatively coupled to the access controller.

29. The method of claim 27 further including the step of performing operational commands based at least in part on a plurality of states of a state machine included in the scan controller by at least one of the data register, the address register, and the protocol generator, the state machine being connected to respective scan paths of the data register, the address register, and the protocol generator.

30. The method of claim 28 further including the step of performing operational commands based at least in part on a plurality of states of a state machine included in the independent scan controller by at least one of the data register, the address register, and the protocol generator, the state machine being connected to respective scan paths of the data register, the address register, and the protocol generator.

31. The method of claim 25 wherein the access controller is implemented on a chip compatible with the protocol of the IEEE 1149.1 standard, the chip including a boundary scan register, the electronic circuit comprising a FLASH memory coupleable to the IEEE 1149.1 compatible chip, and wherein the first providing step, the receiving step, the second providing step, and the third providing step are performed substantially concurrently to program the FLASH memory without using the boundary scan register.

32. A method of accessing an electronic circuit, comprising the steps of:
   programming a programmable logic device with a representation of an access controller, the access controller including
      a scan input terminal,
      a scan output terminal,
      a parallel access bus communicably coupleable to at least one functional I/O of the electronic circuit,
      an address bus communicably coupleable to at least one address input of the electronic circuit,
      a parallel control bus communicably coupleable to at least one control input of the electronic circuit,
      at least one data register having a serial input coupled to the scan input terminal for scanning input data into the data register, a plurality of data terminals coupled to the parallel access bus for providing in parallel the input data to the functional I/O and for receiving in parallel output data from the functional I/O of the electronic circuit, and a serial output coupled to the scan output terminal for scanning the output data out of the data register,
      at least one address register having a serial input coupled to the scan input terminal for scanning at least one address sequence into the address register, the address register being configured to provide in parallel the address sequence to the address input of the electronic circuit over the address bus, and
      a protocol generator coupled to the parallel control bus, the protocol generator including at least one control register for providing in parallel at least one functional control sequence to the control input of the electronic circuit over the parallel control bus; and
   operating the data register, the address register, and the protocol generator of the access controller substantially concurrently to enable testing, debugging, or programmable configuration of the electronic circuit.

33. A scan architecture, comprising:
   a scan controller including a state machine having a plurality of states, at least one of the plurality of states being programmable; and
   at least one scannable register coupled to the scan controller, the scannable register being configured to perform operational commands based at least in part on the plurality of states of the state machine,
   wherein at least one of the plurality of states is programmable to select between a shift-data state and a pause state.

34. A scan architecture, comprising:
   a scan controller including a state machine having a plurality of states, at least one of the plurality of states being programmable; and
   at least one scannable register coupled to the scan controller, the scannable register being configured to perform operational commands based at least in part on the plurality of states of the state machine,
   wherein at least one of the plurality of states is programmable to select between an update-data state and a capture-data state.

35. A scan architecture, comprising:
   a scan controller including a state machine having a plurality of states, at least one the plurality of states being programmable; and
   at least one scannable register coupled to the scan controller, the scannable register being configured to perform operational commands based at least in part on the plurality of states of the state machine,
   wherein the plurality of states comprises a variable sequence of programmable states.

36. The scan architecture of claim 35 wherein the variable sequence of programmable states comprises a shift-data state or a pause state followed by an update-data state or a capture-data state.

37. The scan architecture of claim 35 wherein the variable sequence of programmable states comprises an update-data state or a capture-data state followed by a shift-data state or a pause state.

38. The scan architecture of claim 35 wherein the variable sequence of programmable states comprises an update-data state followed by a capture-data state.

39. The scan architecture of claim 35 wherein the variable sequence of programmable states comprises a capture-data state followed by an update-data state.

40. The scan architecture of claim 35 wherein the scan controller is configured to perform at least one sequence of programmed states a predetermined number of times.

* * * * *

UNITED STATES PATENT AND TRADEMARK OFFICE
CERTIFICATE OF CORRECTION

PATENT NO. : 6,594,802 B1
DATED : July 15, 2003
INVENTOR(S) : Michael Ricchetti et al.

It is certified that error appears in the above-identified patent and that said Letters Patent is hereby corrected as shown below:

Column 1,
Line 40, "l49.1-1990" should read -- 1149.1-1990 --;

Column 22,
Line 28, "chin" should read -- chip --; and

Column 24,
Line 31, "at least one the" should read -- at least one of the --.

Signed and Sealed this

Eighteenth Day of November, 2003

JAMES E. ROGAN
*Director of the United States Patent and Trademark Office*

UNITED STATES PATENT AND TRADEMARK OFFICE
CERTIFICATE OF CORRECTION

PATENT NO.     : 6,594,802 B1
DATED          : July 15, 2003
INVENTOR(S)    : Michael Ricchetti et al.

It is certified that error appears in the above-identified patent and that said Letters Patent is hereby corrected as shown below:

<u>Title page,</u>
Item [73], Assignee, "Durham, NC" should read -- Durham, NH --

Signed and Sealed this

Thirtieth Day of December, 2003

JAMES E. ROGAN
*Director of the United States Patent and Trademark Office*